United States Patent
Ji

(10) Patent No.: US 10,877,697 B2
(45) Date of Patent: Dec. 29, 2020

(54) DATA STORAGE DEVICE AND OPERATING METHOD THEREOF

(71) Applicant: SK hynix Inc., Gyeonggi-do (KR)

(72) Inventor: Seung Gu Ji, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/381,919

(22) Filed: Apr. 11, 2019

(65) Prior Publication Data
US 2019/0332327 A1     Oct. 31, 2019

(30) Foreign Application Priority Data

Apr. 30, 2018    (KR) .................. 10-2018-0049934
Oct. 25, 2018    (KR) .................. 10-2018-0128041

(51) Int. Cl.
*G06F 3/06*        (2006.01)

(52) U.S. Cl.
CPC .......... *G06F 3/0659* (2013.01); *G06F 3/0604* (2013.01); *G06F 3/0679* (2013.01)

(58) Field of Classification Search
CPC .... G06F 3/0659; G06F 3/0604; G06F 3/0679; G11C 11/5642; G11C 16/26; G11C 16/6459
See application file for complete search history.

(56) References Cited

U.S. PATENT DOCUMENTS

| | | | | |
|---|---|---|---|---|
| 2011/0276972 | A1* | 11/2011 | Chung | G06F 9/5016 |
| | | | | 718/103 |
| 2013/0024605 | A1* | 1/2013 | Sharon | G06F 11/1044 |
| | | | | 711/103 |
| 2014/0269071 | A1* | 9/2014 | Pandya | G11C 29/82 |
| | | | | 365/185.11 |
| 2019/0088340 | A1* | 3/2019 | Shirakawa | G11C 7/06 |

FOREIGN PATENT DOCUMENTS

KR     1020150018732     2/2015

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017. (Year: 2017).*

* cited by examiner

*Primary Examiner* — Khoa D Doan
(74) *Attorney, Agent, or Firm* — IP & T Group LLP

(57) ABSTRACT

A data storage device includes a nonvolatile memory device including one or more memory blocks having a first region and a second region and a controller configured to generate one or more write commands for writing data in the first region and the second region and transmit the one or more write commands to the nonvolatile memory device. The nonvolatile memory device includes a page buffer configured to store data to be written in the memory block and a control logic configured to control, based on the one or more (Continued)

write commands, the nonvolatile memory device to write the data in the first region and retain the data in the page buffer and to write the data retained in the page buffer in the second region.

11 Claims, 19 Drawing Sheets

------▶ FIRST WRITE OPERATION
———▶ SECOND WRITE OPERATION

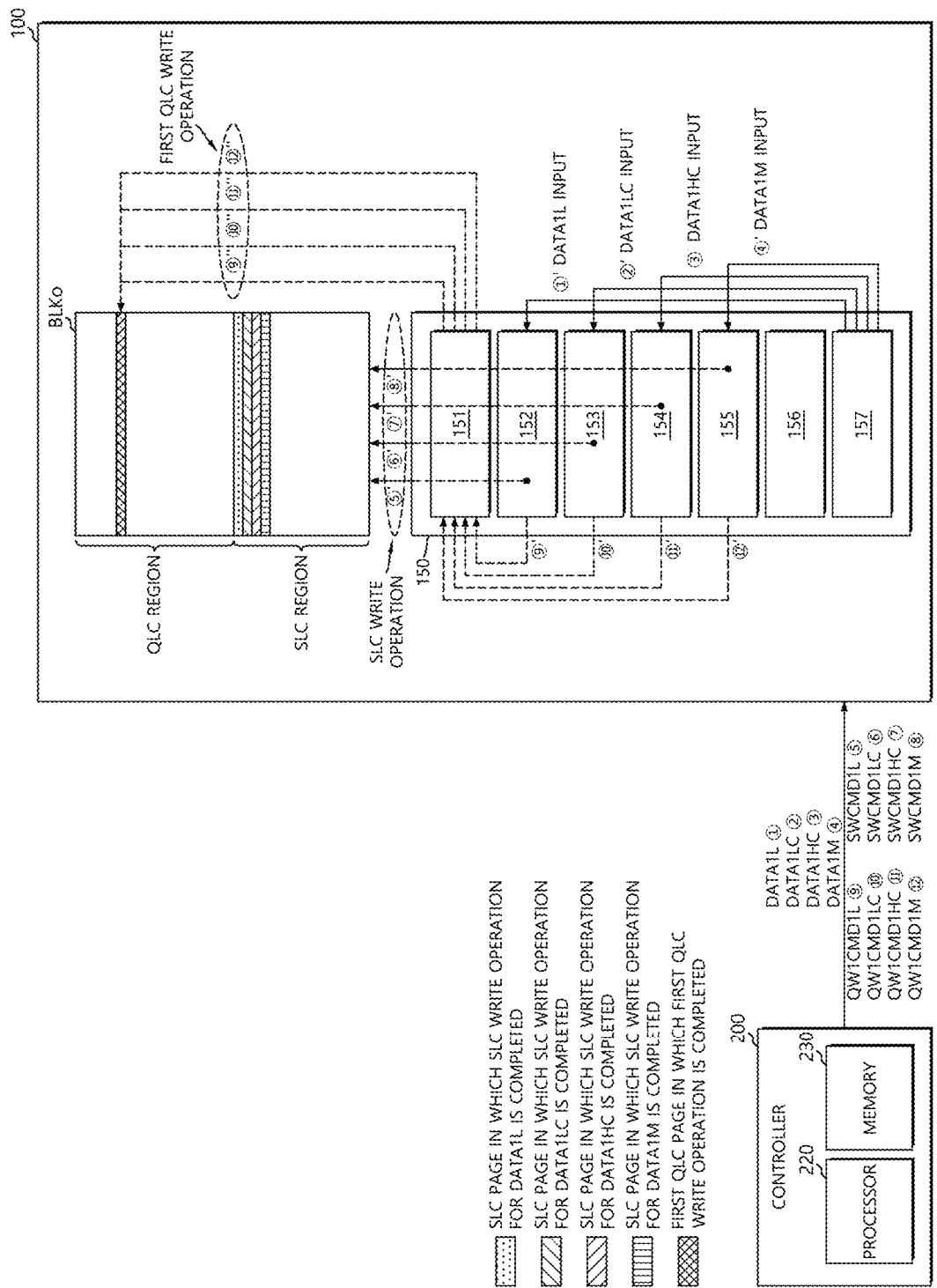

<SLC PAGE IN WHICH SLC WRITE OPERATION IS COMPLETED>

<QLC PAGE IN WHICH FIRST QLC WRITE OPERATION IS COMPLETED>

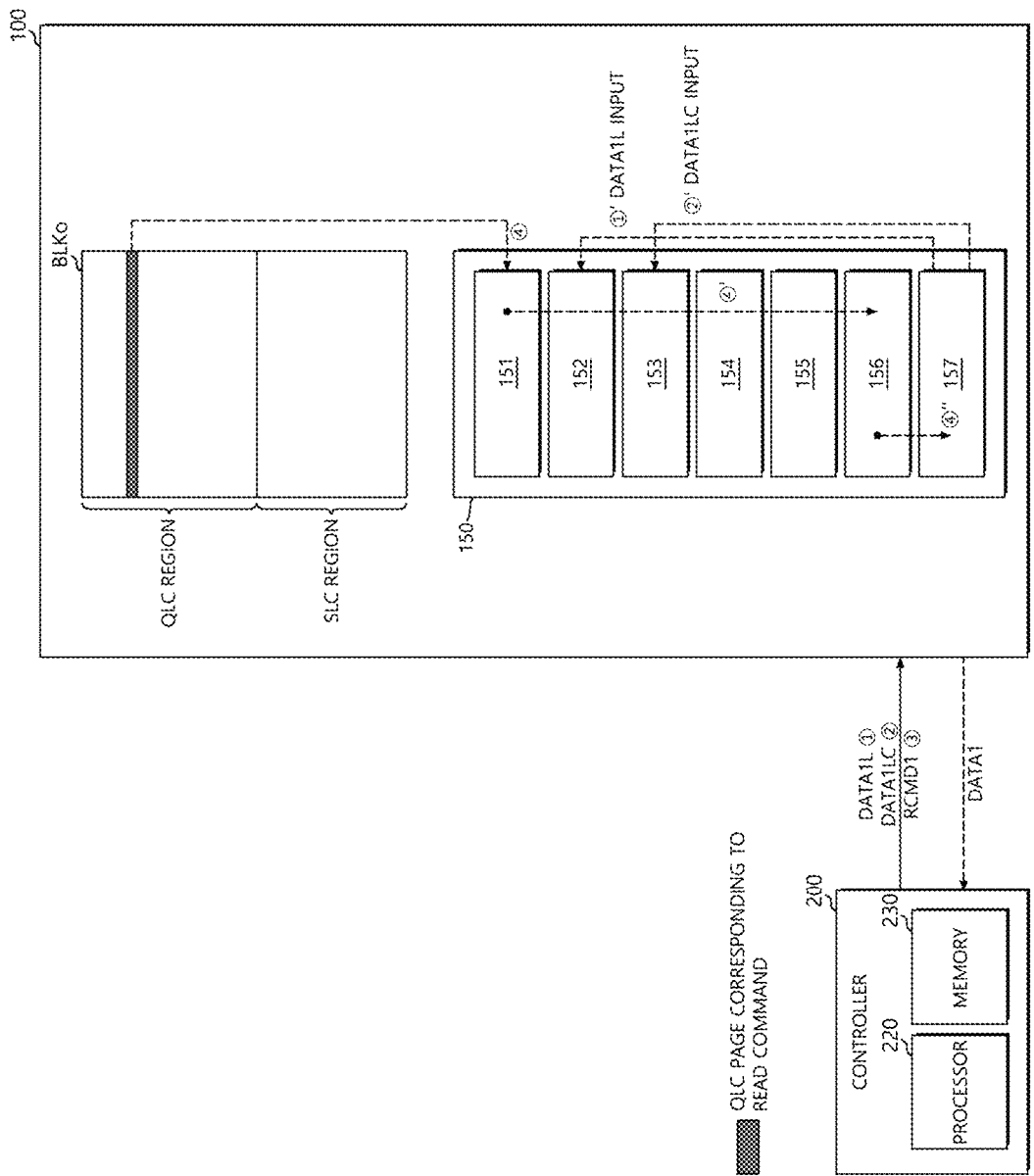

DATA STORAGE DEVICE AND OPERATING METHOD THEREOF

CROSS-REFERENCE TO RELATED APPLICATIONS

The present application claims priority under 35 U.S.C. § 119(a) to Korean application number 10-2018-0049934, filed on Apr. 30, 2018, and Korean application number 10-2018-0128041, filed on Oct. 25, 2018, in the Korean Intellectual Property Office, which is incorporated herein by reference in its entirety.

BACKGROUND

1. Technical Field

Various embodiments generally relate to a semiconductor device, and more particularly, to a data storage device and an operating method thereof.

2. Related Art

Recently, the paradigm for computer environments has changed to ubiquitous computing in which computer systems may be used anytime, anywhere. As a result, use of portable electronic apparatuses such as a mobile phone, a digital camera, and a laptop computer has been increasing rapidly. Generally, portable electronic apparatuses use data storage devices that employ memory devices. Data storage devices may be used to store data used in the portable electronic apparatuses.

Data storage devices using memory devices have no mechanical driving units and exhibit good stability and endurance, fast information access rate, and low power consumption. Such data storage devices may include a universal serial bus (USB) memory device, a memory card having various interfaces, a universal flash storage (UFS) device, a solid state drive (SSD), and the like.

SUMMARY

Embodiments are provided to a data storage device with improved write performance and an operating method thereof.

In an embodiment of the present disclosure, a data storage device may include: a nonvolatile memory device including at least one memory block having a first region and a second region; and a controller configured to generate a plurality of write commands for the first region and the second region and transmit the plurality of write commands to the nonvolatile memory device. The nonvolatile memory device may include a page buffer configured to store data to be written in the at least one memory block; and control logic configured to control, based on the plurality of write commands, the nonvolatile memory device to write the data in the first region and retain the data in the page buffer and to write the retained data in the second region.

In an embodiment of the present disclosure, an operating method of a data storage device which includes a nonvolatile memory device including at least one memory block having a first region and a second region; and a controller configured to control the nonvolatile memory device, the method may include: performing a first write operation which includes writing data in the first region based on a plurality of write commands provided from the controller and retaining the data in a page buffer of the nonvolatile memory device; and performing a second write operation which includes writing the retained data in the second region based on the plurality of write commands.

In an embodiment of the present disclosure, a data storage device may include: a memory device including a page buffer, a first memory region and a second memory region; and a controller suitable for controlling the memory device to perform a write operation. The memory device is configured to receive write data from the controller; store the write data in the page buffer; write the stored data in the first memory region; retain the written data in the page buffer; and write the retained data in the second memory region.

According to embodiments, write data stored in the page buffer may not be deleted and may be retained even after a single level cell (SLC) write operation on the write data is performed and then may be used in a first quadruple level cell (QLC) write operation. Accordingly, since it is not necessary to transfer the same write data repeatedly, the performance of the write operation may be improved due to increase in a rate of the write operation.

The performance of the data storage device may be improved by preferentially processing a command having a higher priority than the write command during the write operation.

These and other features, aspects, and embodiments are described below.

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIGS. 4A and 46 are circuit diagrams illustrating memory blocks according to an embodiment of the present disclosure;

FIG. 7A is a diagram illustrating a single level cell (SLC) write operation and a first quadruple level cell (QLC) write operation according to an embodiment of the present disclosure;

FIG. 12A is a diagram illustrating a process for preferentially processing a command having a high priority during data transfer according to an embodiment of the present invention;

DETAILED DESCRIPTION

Figure 1:
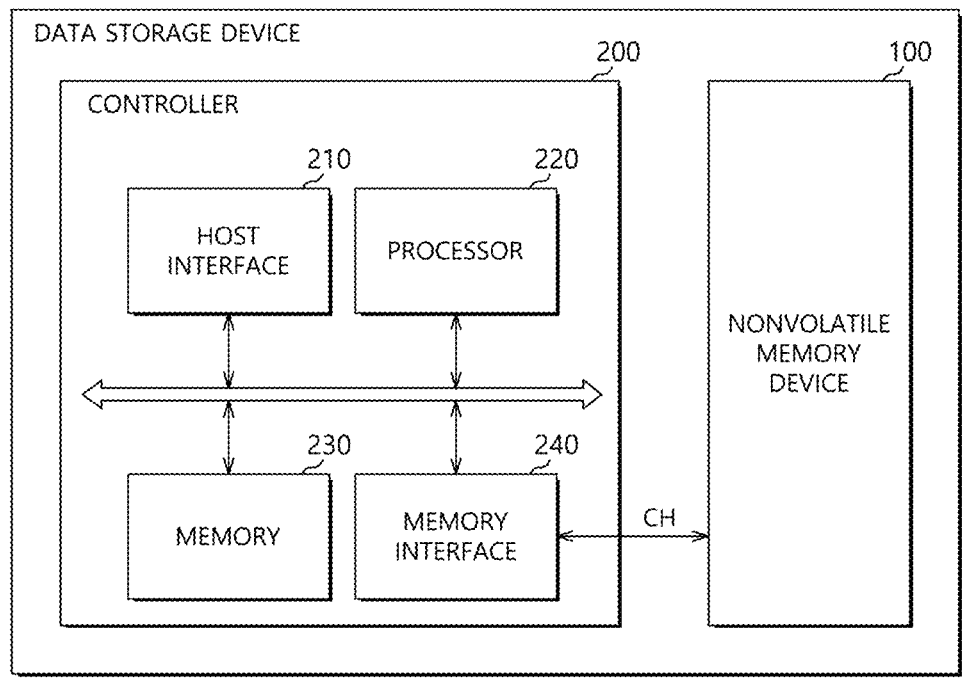
FIG. 1 is a diagram illustrating a configuration of a data storage device according to an embodiment of the present disclosure.

Various embodiments of the present invention will be described in greater detail with reference to the accompanying drawings. Schematic illustrations in the drawings are intended to illustrate aspects and features of the present invention. Such illustrations are not intended to be representative of actual component shapes or sizes.

Embodiments of the present invention are described herein with reference to various illustrations of elements and features of the present invention. However, the present invention is not limited to particulars shown in the drawings or specific terminology used to describe the embodiments. Although various embodiments of the present invention are shown and described, it will be appreciated by those skilled in the art in light of the present disclosure that changes may be made in these embodiments without departing from the principles and spirit of the present invention. Also, reference to "an embodiment," "another embodiment" or the like is not necessarily to only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

FIG. 1 is a diagram illustrating a configuration of a data storage device 10 according to an embodiment.

Referring to FIG. 1, the data storage device 10 may store data to be accessed by a host device (not shown) such as a mobile phone, an MP3 player, a laptop computer, a desktop computer, a game player, a television (TV), or an in-vehicle infotainment system, and the like. The data storage device 10 may refer to a memory system.

The data storage device 10 may be configured as any of various types of storage devices according to an interface protocol coupled to a host device. For example, the data storage device 10 may be configured as any of various types of storage devices, such as a solid state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-e or PCIe) card type storage device, a compact flash (CF) card, a smart media card, a memory stick, and the like.

The data storage device 10 may be manufactured as any of various types of packages, such as a package on package (PoP), a system in package (SiP), a system on chip (SoC), a multi-chip package (MCP), a chip on board (CoB), a wafer-level fabricated package (WFP), and a wafer-level stack package (WSP).

The data storage device 10 may include a nonvolatile memory device 100 and a controller 200.

The nonvolatile memory device 100 may be operated as a storage medium of the data storage device 10. The nonvolatile memory device 100 may include any of various types of nonvolatile memory devices according to a memory cell, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (RERAM) using a transition metal compound.

Figure 2:
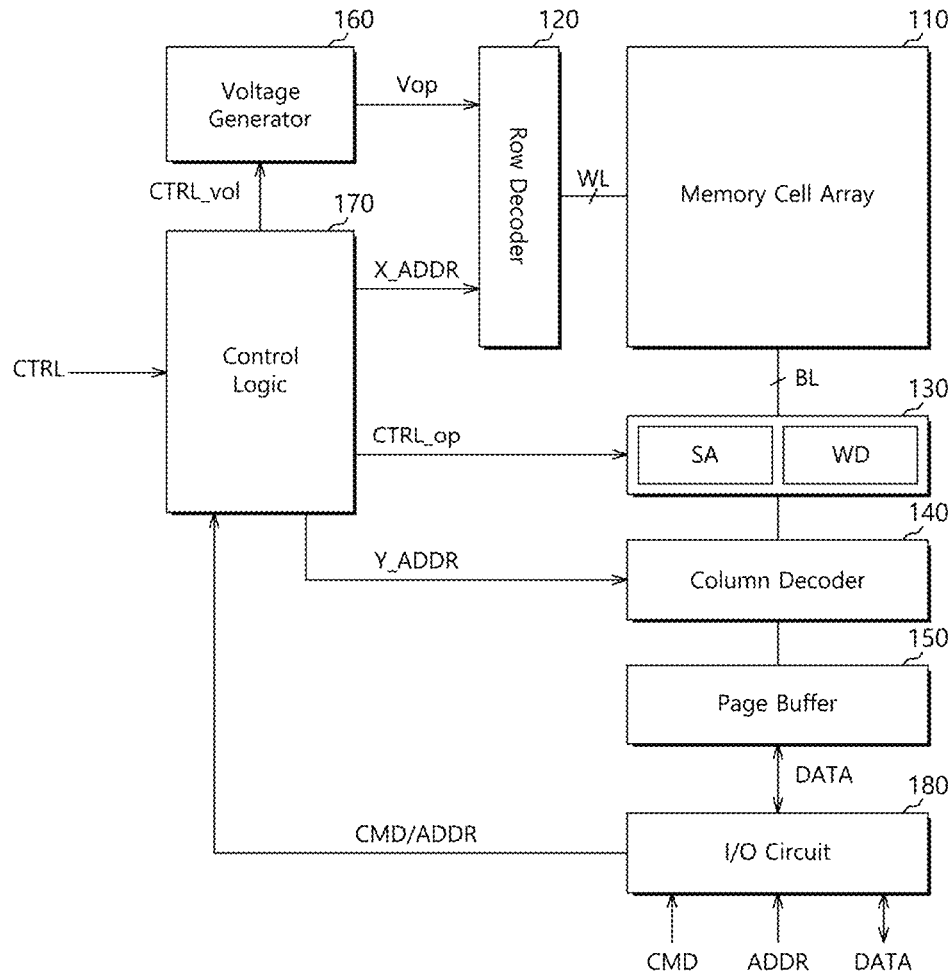
FIG. 2 is a diagram illustrating a configuration of a nonvolatile memory device according to an embodiment of the present disclosure.
Figure 3:
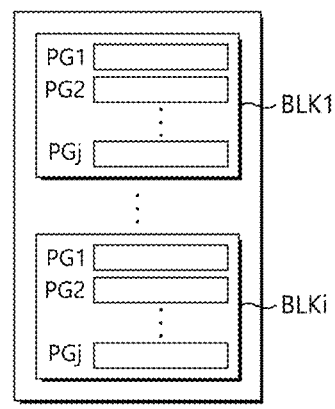
FIG. 3 is a diagram illustrating a configuration of a memory cell array according to an embodiment of the present disclosure.

FIG. 2 is a diagram illustrating a configuration of the nonvolatile memory device 100 of FIG. 1, and FIG. 3 is a diagram illustrating a configuration of a memory cell array 110 of FIG. 2.

Referring to FIG. 2, the nonvolatile memory device 100 may include the memory cell array 110, a row decoder 120, a write and read (write/read) circuit 130, a column decoder 140, a page buffer 150, a voltage generator 160, control logic 170, and an input and output (I/O) circuit 180.

The memory cell array 110 may include a plurality of memory cells (not shown) arranged in regions in which a plurality of word lines WL and a plurality of bit lines BL cross each other. Referring to FIG. 3, the memory cell array 110 may include a plurality of memory blocks BLK1 to BLKi and each of the plurality of memory blocks BLK1 to BLKi may include a plurality of pages PG1 to PGj.

Referring back to FIG. 2, each of the memory cells in the memory cell array 110 may be one of a single level cell (SLC) in which a single bit data (for example, 1-bit data) is to be stored, a multi-level cell (MLC) in which 2-bit data is to be stored, a triple level cell (TLC) in which 3-bit data is to be stored, and a quadruple level cell (QLC) in which 4-bit data is to be stored. The memory cell array 110 may include one or more memory cells among the SLC, the MLC, the TLC, and the QLC. The memory cell array 110 may include memory cells arranged in a two-dimensional (2D) horizontal structure or memory cells arranged in a 3D vertical structure.

The row decoder 120 may be coupled to the memory cell array 110 through the word lines WL. The row decoder 120 may be operated according to control of the control logic 170. The row decoder 120 may decode a row address X_ADDR provided from the control logic 170 and select and drive at least one word line WL of the word lines WL based on a decoding result. The row decoder 120 may provide an operation voltage Vop provided from the voltage generator 160 to the selected word line WL.

The write/read circuit 130 may be coupled to the memory cell array 110 through the bit lines BL. The write/read circuit 130 may include write/read circuits (not shown) corresponding to the bit lines BL. The write/read circuit 130 may be operated according to control of the control logic 170. The write/read circuit 130 may include a write driver WD configured to write data in the memory cells and a sense amplifier SA configured to amplify data read out from the memory cells. The write/read circuit 130 may perform write and read operations on selected memory cells by providing a current pulse or a voltage pulse to the memory cells selected through the row decoder 120 and the column decoder 140.

The column decoder 140 may be operated according to control of the control logic 170. The column decoder 140 may decode a column address Y_ADDR provided from the control logic 170. The column decoder 140 may couple the write/read circuits of the write/read circuit 130 corresponding to the bit lines BL to the page buffer 150 based on a decoding result.

The page buffer 150 may be configured to temporarily store data which is provided from a memory interface 240 of the controller 200 and is to be written in the memory cell array 110, and data which is read out from the memory cell array 110 and is to be provided to the memory interface 240 of the controller 200. The page buffer 150 may be operated according to control of the control logic 170.

The voltage generator 160 may generate various voltages for performing a write, read, and erase operations on the memory cell array 110 based on a voltage control signal CTRL_vol provided from the control logic 170. The voltage generator 160 may generate driving voltages Vop for driving the plurality of word lines WL and the plurality of bit lines BL. The voltage generator 160 may generate at least one or more reference voltages for reading out data stored in the memory cell MC.

The control logic 170 may output various control signals for writing data DATA in the memory cell array 110 or reading out data DATA from the memory cell array 110, based on a command CMD, an address ADDR, and a control signal CTRL received from the controller 200. The various control signals output from the control logic 170 may be provided to the row decoder 120, the write/read circuit 130, the column decoder 140, the page buffer 150, and the voltage generator 160. Accordingly, the control logic 170 may completely control the various operations performed in the nonvolatile memory device 100.

For example, the control logic 170 may generate an operation control signal CTRL_op based on the command CMD and the control signal CTRL and provide the generated operation control signal CTRL_op to the write/read circuit 130. The control logic 170 may provide the row address X_ADDR and the column address Y_ADDR included in the address ADDR to the row decoder 120 and the column decoder 140.

The I/O circuit 180 may be configured to receive the command CMD, the address ADDR, and the data DATA provided from the controller 200 or provide the data DATA read out from the memory cell array 110 to the controller 200. The I/O circuit 180 may output the command CMD and the address ADDR received from the controller 200 to the control logic 170 and output the data DATA received from the controller 200 to the page buffer 150. The I/O circuit 180 may output data DATA received from the page buffer 150 to the controller 200. The I/O circuit 180 may be operated according to control of the control logic 170.

Referring back to FIG. 1, the controller 200 may control an overall operation of the data storage device 10 through the driving of firmware or software loaded into a memory 230. The controller 200 may decode and drive a code-type instruction or algorithm such as firmware or software. The controller 200 may be implemented with hardware or a combination of hardware and software.

The controller 200 may include a host interface 210, a processor 220, the memory 230, and the memory interface 240.

The host interface 210 may perform interfacing between a host device and the data storage device 10 according to a protocol of the host device. For example, the host interface 210 may communicate with the host device through any one protocol among a universal serial bus (USB) protocol, a universal flash storage (UFS) protocol, a multimedia card (MMC) protocol, a parallel advanced technology attachment (PATA) protocol, a serial advanced technology attachment (SATA) protocol, a small computer system interface (SCSI) protocol, a serial attached SCSI (SAS) protocol, a PCI protocol, and a PCI-e protocol.

The processor 220 may be configured as a micro control unit (MCU) and/or a central processing unit (CPU). The processor 220 may process a request received from the host device. To process the request from the host device, the processor 220 may drive a code-type instruction or algorithm (for example, firmware) loaded into the memory 230 and control internal function blocks such as the host interface 210, the memory 230, and the memory interface 240 and the nonvolatile memory device 100.

The processor 220 may generate control signals for controlling an operation of the nonvolatile memory device 100 based on the requests from the host device and provide the generated control signals to the nonvolatile memory device 100 through the memory interface 240.

The memory 230 may be configured as a random access memory (RAM) such as a dynamic RAM (DRAM) or a static RAM (SRAM). The memory 230 may store firmware driven through the processor 220. The memory 230 may store data (for example, meta data) required for driving of the firmware. For example, the memory 230 may be operated as a working memory of the processor 220.

The memory 230 may be configured to include a data buffer (DB) (not shown) which temporarily stores write data to be transmitted from the host device to the nonvolatile memory device 100 or read data to be transmitted from the nonvolatile memory device 100 to the host device. For example, the memory 230 may be operated as a buffer memory.

The memory interface 240 may control the nonvolatile memory device 100 according to control of the processor 220. The memory interface 240 may refer to a memory controller. The memory interface 240 may provide control signals to the nonvolatile memory device 100. The control signals may include the command CMD, the address ADDR, and the operation control signal (CTRL) for controlling the nonvolatile memory device 100. The memory interface 240 may provide the data DATA to the nonvolatile memory device 100 or receive the data DATA from the nonvolatile memory device 100.

Figure 4A:
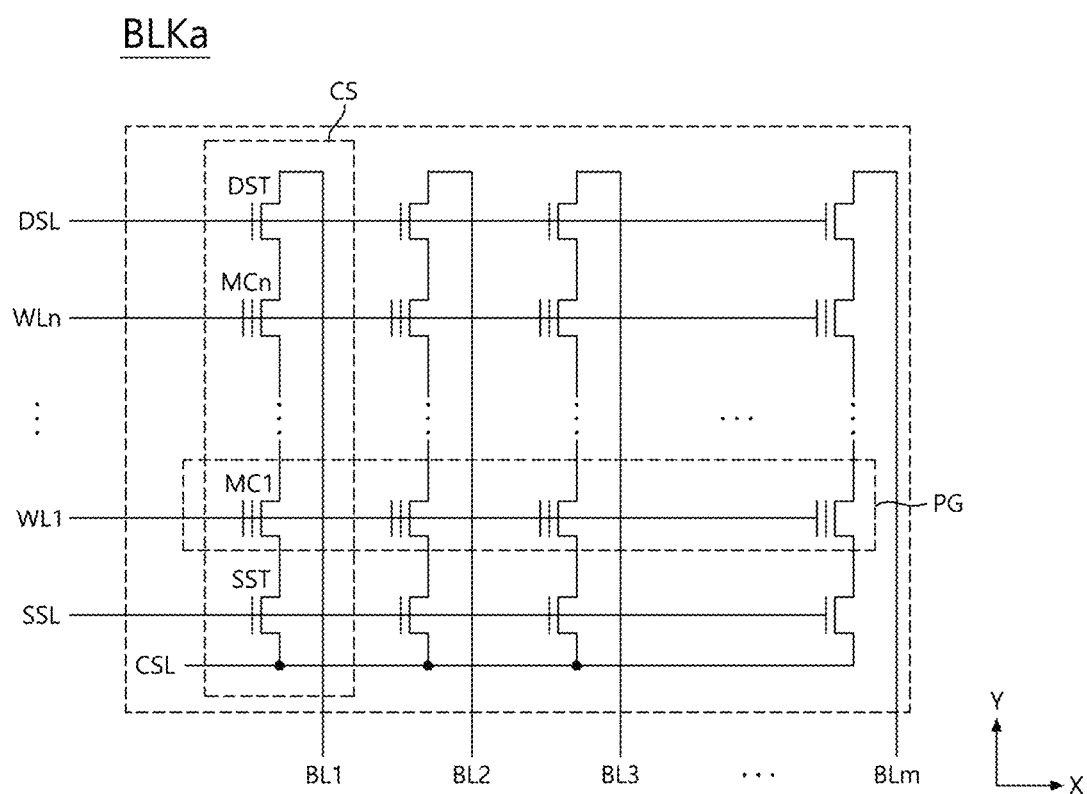

FIGS. 4A and 46 are circuit diagrams illustrating implementation examples of a memory block of FIG. 3. FIG. 4A is a circuit diagram illustrating a memory block BLKa including memory cells arranged in a two-dimensional (2D) manner, and FIG. 46 is a circuit diagram illustrating a memory block BLKb including memory cells arranged in a two-dimensional (3D) manner. As shown in FIG. 3, the memory cell array 110 may include the plurality of memory blocks BLK1 to BLKi and each of the memory blocks BLK1 to BLKi may be implemented with the circuit illustrated in FIG. 4A or 4B. However, the configuration of the memory block is not limited thereto.

Referring to FIG. 4A, the memory block BLKa may have a 2D horizontal structure. The memory block BLKa may include a plurality of bit lines BL1 to BLm arranged to be spaced in a first direction and a plurality of word lines WL1 to WLn arranged to be spaced in a second direction. Here, the first direction may be an X-axis direction and the second direction may be a Y-axis direction. However, the arrangement is not limited thereto, the first direction may be the Y-axis direction and the second direction may be the X-axis direction.

The memory block BLKa may include a plurality of cell strings CS coupled to the plurality of bit lines BL1 to BLm. The cell strings CS may have the same circuit configuration as each other. For clarity, the memory block BLKa will be described based on one cell string CS.

The cell string CS may include a plurality of memory cells MC1 to MCn and select transistors DST and SST coupled between the bit line BL1 and a common source line CSL. For example, the cell string CS may include a drain select transistor DST coupled to a drain select line DSL, the plurality of memory cells MC1 to MCn coupled to the plurality of word lines WL1 to WLn, and a source select transistor SST coupled to a source select line SSL.

As shown in FIG. 4A, a plurality of memory cells coupled to the same word line may refer to a page PG unit. The write operation or the read operation may be simultaneously performed on the plurality of memory cells coupled to the same word line, but the present invention is not limited to that operational configuration.

Figure 4B:
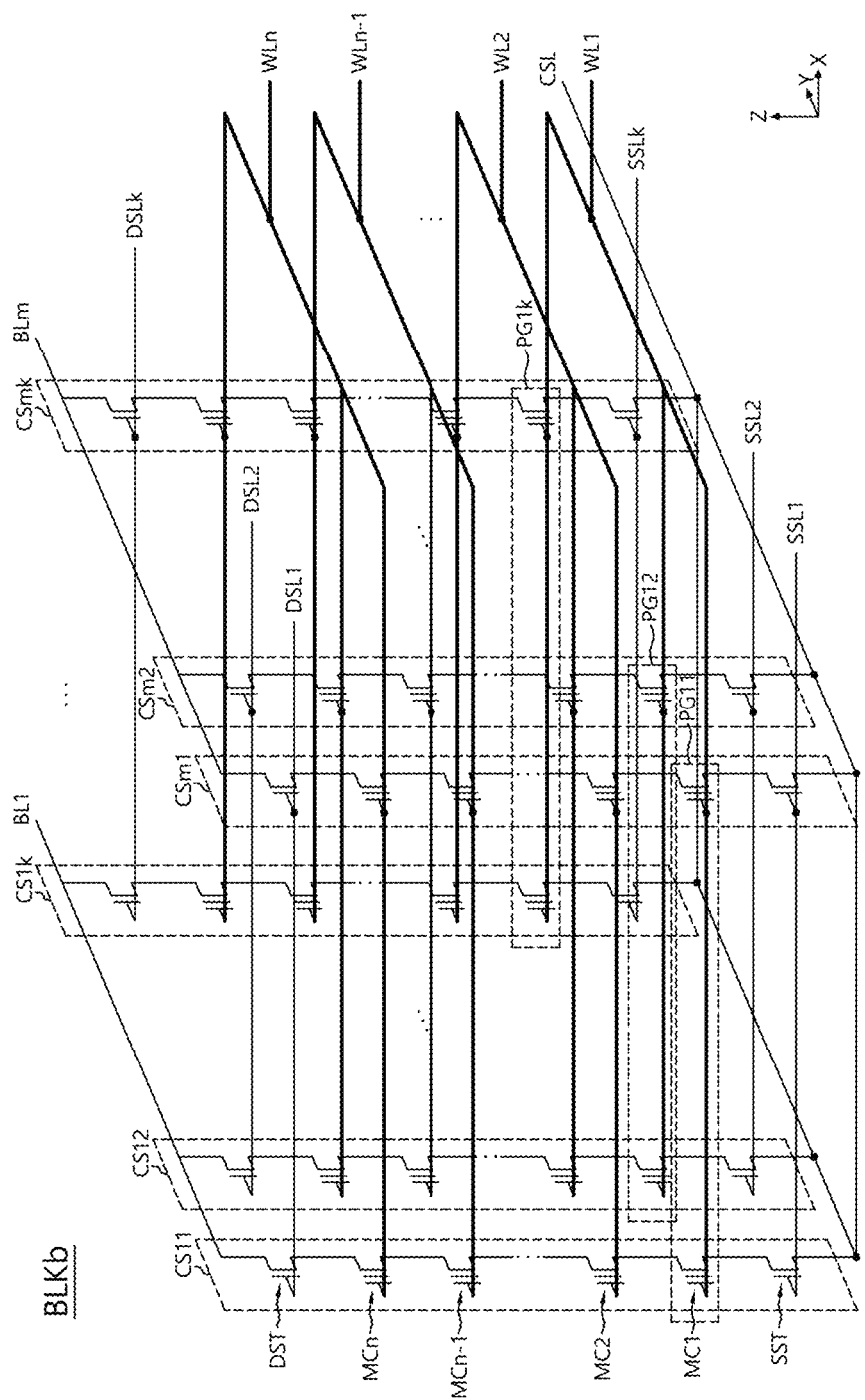

Referring to FIG. 4B, the memory block BLKb may have a 3D vertical structure.

The memory block BLKb may include a plurality of bit lines BL1 to BLm arranged and spaced in a first direction, a plurality of cell strings CS11 to CS1$k$~CSm1 to CSmk coupled to the plurality of bit lines BL1 to BLm and arranged and spaced in a second direction, and a plurality of word lines WL1 to WLn arranged and spaced in a third direction. Here, the first direction may be an X-axis direction, the second direction may be a Y-axis direction, and the third direction may be a Z-axis direction; however, the arrangement is not limited thereto.

K cell strings may be coupled to each of m bit lines and thus (m×k) cell strings may be arranged in the memory block BLKb. Here, each of n, m, and k is an integer of 1 or more.

Each of the plurality of cell strings CS11 to CS1$k$~CSm1 to CSmk may include at least one source select transistor SST, first to n-th memory cells MC1 to MCn, and at least one drain select transistor DST. The source select transistor SST in each cell string may be coupled between the common source line CSL and the memory cells MC1 to MCn.

Source select transistors SST of cell stings arranged on the same line in the X-axis direction may be coupled to the same source select line. For example, the source select transistors SST of a plurality of first cell strings CS11 to CSm1 coupled to the bit lines BL1 to BLm may be coupled to a first source select line SSL1. Similarly, the source select transistors SST in the plurality of second to k-th cell strings CS12 to CSm2~CS1$k$ to CSmk coupled to the bit lines BL1 to BLm may be coupled to second to k-th source select lines SSL2 to SSLk.

Drain select transistors DST of the cell strings arranged on the same line in the X-axis direction may be coupled to the same drain select line. For example, the drain select transistors DST of the plurality of first cell strings CS11 to CSm1 coupled to the bit lines BL1 to BLm may be coupled to a first drain select line DSL1. Similarly, the drain select transistors DST in the plurality of second to k-th cell strings CS12 to CSm2~CS1$k$ to CSmk coupled to the bit lines BL1 to BLm may be coupled to second to k-th drain select lines DSL2 to DSLk.

The first to nth memory cells MC1 to MCn in each of the plurality of cell strings CS11 to CS1$k$~CSm1 to CSmk may be coupled in series between the source select transistor SST and the drain select transistor DST.

The first to n-th memory cells MC1 to MCn in each of the plurality of cell strings CS11 to CS1$k$~CSm to CSmk may be coupled to first to nth word lines WL1 to WLn. The memory cells coupled to the cell stings arranged on the same line in the X-axis direction and coupled to the same word line may refer to a page unit.

For example, as shown in FIG. 4B, the first memory cells MC1 coupled to the first cell strings CS11 to CSm1 arranged on the same line in the X-axis direction and coupled to the first word line WL1 may refer to a first-first page PG11. Similarly, the first memory cells MC1 coupled to the second to k-th cell strings S12 to CSm2~CS1$k$ to CSmk arranged on the same line in the X-axis direction and coupled to the first word line WL1 may refer to first-second to first-(k)-th pages PG12 to PG1$k$. For example, in the 3D vertical structure shown in FIG. 4B, a plurality of pages may be coupled to one word line, but the present invention is not limited thereto.

K pages may be coupled to each of the word lines WL1 to WLn and thus (n×k) pages may be arranged in the memory block BLKb. The number of pages in each of the word lines WL1 to WLn may be changed according to the number of cell strings coupled to each of the bit lines BL1 to BLm.

A write operation for the memory block having the 3D vertical structure shown in FIG. 46 is described below, by way of example.

Figure 5:
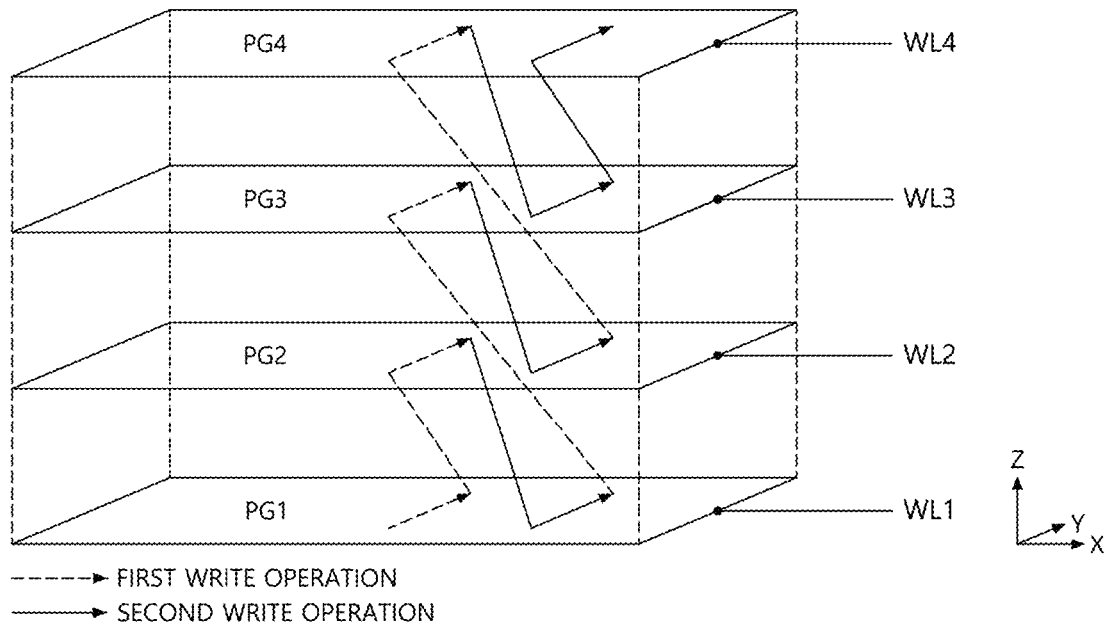
FIG. 5 is a diagram illustrating a write operation according to an embodiment of the present disclosure.

FIG. 5 is a diagram illustrating a write operation for a memory block BLKo having a 3D vertical structure. By way of example, and in the context of the description here, the memory block BLKo includes four word lines WL1 to WL4 and pages PG1 to PG4 are coupled to the word lines WL1 to WL4.

Referring to FIG. 5, the write operation for the memory block BLKo may start from the first page PG1 of the first word line WL1 and may be terminated in the fourth page PG4 of the fourth word line WL4.

For example, the write operation on the memory block BLKo may be performed in order of the first write operation for the first page PG1 of the first word line WL1→the first write operation for the second page PG2 of the second word line WL2→the second write operation for the first page PG1 of the first word line WL1→the first write operation for the third page PG3 of the third word line WL3→the second write operation for the second page PG2 of the second word line WL2→the first write operation for the fourth page PG4 of the fourth word line WL4→the second write operation for the third page PG3 of the third word line WL3→the second write operation for the fourth page PG4 of the fourth word line WL4. Accordingly, data may be normally written in the first to fourth pages PG1 to PG4 of the first to fourth word lines WL1 to WL4.

Here, the first write operation performed on the first to fourth word lines WL1 to WL4 may refer to a foggy write operation and the second write operation performed on the first to fourth word lines WL1 to WL4 may refer to a fine write operation. Data to be stored through the first write operation for an arbitrary word line and data to be stored through the second write operation for the arbitrary word line may be the same, but the present invention is not limited thereto. The reason that the same data is written twice in each of the pages of the word lines WL1 to WL4 will be described below.

As the capacity of the nonvolatile memory device 100 increases, a size of data to be stored in one memory cell may also increase proportionately. In recent years, the use of a quadruple level cell (QLC) in which four-bit data is stored in one memory cell has increased. With the high integration of the memory cell array 110 of FIG. 2, a space between signal lines (e.g., word lines and bit lines) are reduced. Accordingly, interference may occur in a word line adjacent to another word line in which the write operation is being performed, for example, a previous word line in which the write operation is completed. As a result of the interference, the data stored in the previous word line may be corrupted. Here, corruption of the stored data may mean that the threshold voltage distributions of memory cells coupled to the previous word line are deformed.

To solve the concerns above, in various embodiments, the write operation through the QLC may include a first QLC write operation (for example, foggy write operation), another first QLC write operation, and a second QLC write operation (for example, fine write operation), which are sequentially performed. First, through the first QLC write operation (for example, foggy write operation), first data in first memory cells coupled to a first word line among a plurality of word lines may be stored. Second, through the first QLC write operation (for example, foggy write operation), second data in second memory cells coupled to next word line (for example, a second word line) adjacent to the first word line may be stored. Third, through the second QLC write operation (for example, fine write operation), the first data in the first memory cells of the first word line may be stored.

Figure 7B:
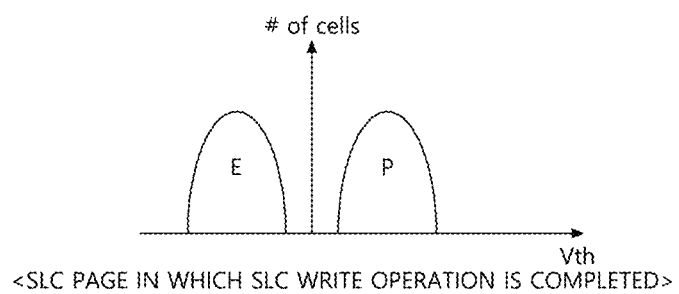
FIGS. 7B and 7C are diagrams illustrating threshold voltage distributions of a single level cell (SLC) page in which a SLC write operation is completed and a quadruple level cell (QLC) page in which a first QLC write operation is completed.
Figure 7C:
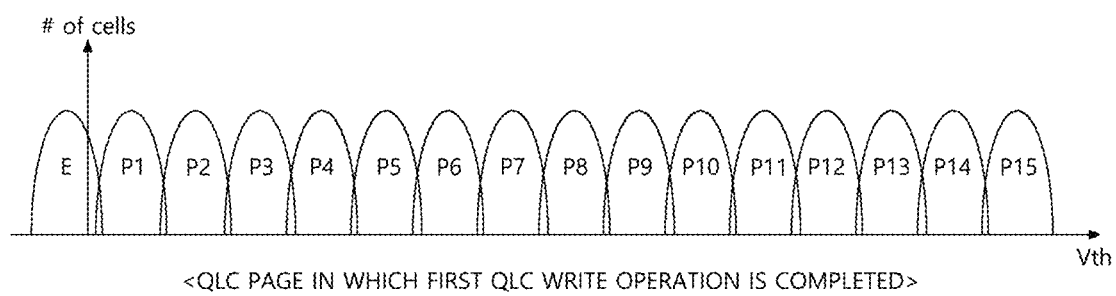

When the first QLC write operation has been performed, the threshold voltage distributions of the memory cells may not be clearly distinguished from each other as shown in FIG. 7C. For example, the overlapping portion between the threshold voltage distributions may be generated. When the second QLC write operation has been performed, the threshold voltage distributions of the memory cells may be clearly distinguished from each other as shown in FIG. 8B. The threshold voltage distributions may be completely separated from each other without the overlapping portion.

Accordingly, since the threshold voltage distributions of the memory cells coupled to a previous word line are deformed by the interference due to the write operation performed on next word line, the first QLC write operation on the previous word line may be performed so that the threshold voltage distributions of the memory cells are close to the desired threshold voltage distribution. Next, when the first QLC write operation for the next word line is completed, the second QLC write operation may be performed on the previous word line so that the threshold voltage distributions of the memory cells coupled to the previous word line may become the desired threshold voltage distribution.

Figure 6:
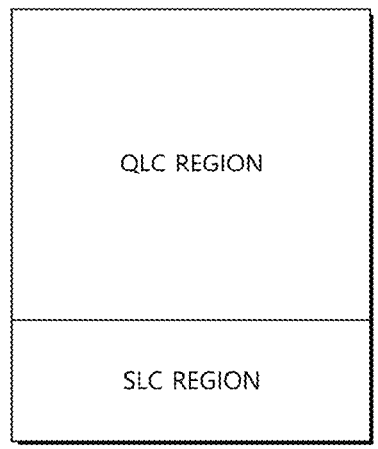
FIG. 6 is a diagram illustrating a configuration of a memory block according to an embodiment of the present disclosure.

FIG. 6 is a diagram illustrating a configuration of the memory block BLKo according to an embodiment.

Referring to FIG. 6, the memory block BLKo may be divided into a plurality of regions. For example, the memory block BLKo may be divided into a single level cell (SLC) region SLC REGION including memory cells for storing 1-bit data and a quadruple level cell (QLC) region QLC REGION including memory cells for storing 4-bit data. The SLC region SLC REGION and the QLC region QLC REGION may be logically separated from each other, but the present invention is not limited thereto.

The size of the SLC region SLC REGION in the memory block BLKo may vary. For example, if necessary, the size of the SLC region SLC REGION may be increased or reduced. When the size of the SLC region SLC REGION is increased, the QLC region QLC REGION may be reduced by the same amount. When the size of the SLC region SLC REGION is reduced, the QLC region QLC REGION may be increased by the same amount.

Each of the SLC region SLC REGION and the QLC region QLC REGION may include a plurality of pages. The write or read operation of the SLC region SLC REGION may be performed in one page unit. The write or read operation of the QLC region QLC REGION may be performed in plural page units. Here, the page unit may refer to a logical page unit.

In an embodiment, the write operation for the memory block BLKo may include a SLC write operation for writing data in the SLC region SLC REGION and a QLC write operation for writing data in the QLC region QLC REGION. The QLC write operation may include the first QLC write operation and the second QLC write operation described above.

FIG. 7A is a diagram illustrating a SLC write operation and a first QLC write operation for the memory block BLKo according to an embodiment, FIG. 7b is a diagram illustrating a state in which the SLC write operation is completed, and FIG. 7C is a diagram illustrating a state in which the first QLC write operation is completed. The write operations of FIGS. 7A to 7C for the nonvolatile memory device 100 may be performed by the processor 220 of the controller 200, as shown in FIGS. 1 and 2.

Referring to FIG. 7A, the processor 220 may sequentially transmit write data received with a write request from a host to the nonvolatile memory device 100. The processor 220 may generate a plurality of write commands based on the write request received from the host and sequentially transmit the plurality of write commands to the nonvolatile memory device 100.

For example, the processor 220 may sequentially transmit write data DATA1L, DATA1LC, DATA1HC, and DATA1M received from the host to the nonvolatile memory device 100 (①~④). Although not specifically shown in FIG. 7A, the processor 220 may transmit the write data DATA1L to DATA1M with write data storage commands corresponding thereto to the nonvolatile memory device 100. The nonvolatile memory device 100 may store the write data DATA1L to DATA1M sequentially received from the processor 220 in corresponding data buffers of the page buffer 150 based on the write data storage commands corresponding to the write data DATA1L to DATA1M.

As shown in FIG. 7A, the page buffer 150 of the nonvolatile memory device 100 may include input/output (I/O) buffers 151 and 157, data buffers 152 to 155, and a preliminary data buffer 156. Although FIG. 7A shows that the page buffer 150 of the nonvolatile memory device 100 includes four data buffers and one preliminary data buffer, the numbers of data buffers and preliminary data buffers included in the page buffer 150 is not limited thereto.

The write data DATA1L to DATA1M (for example, first-first to first-fourth write data DATA1L to DATA1M) sequentially transmitted from the processor 220 may be sequentially input to the first I/O buffer 157 of the page buffer 150 of the nonvolatile memory device 100. The nonvolatile memory device 100 may store the first-first to first-fourth write data DATA1L to DATA1M sequentially input to the first I/O buffer 157 in the corresponding data buffers 152 to 155 (①'~④'). The first-first to first-fourth write data DATA1L to DATA1M may be written in one page coupled to one word line of the QLC region of the memory block BLKo. By way of example, the process of FIG. 7A is a write process for one page coupled to a first word line of the QLC region.

The processor 220 may generate SLC write commands SWCMD1L, SWCMD1LC, SWCMD1HC, and SWCMD1M based on a write request received from a host and sequentially transmit the generated four SLC write commands SWCMD1L to SWCMD1M to the nonvolatile memory device 100 (⑤~⑧). The processor 220 may transmit the SLC write commands SWCMD1L to SWCMD1M with address information corresponding thereto to the nonvolatile memory device 100. The address information may indicate physical spaces in which the first-first to first-fourth write data DATA1L to DATA1M are to be stored in the SLC region of the nonvolatile memory device 100. The address information corresponding to the SLC write commands SWCMD1L to SWCMD1M may indicate the physical spaces different from each other. In another embodiment, the address information may be simultaneously transmitted when the first-first to first-fourth write data DATA1L to DATA1M are transmitted to the nonvolatile memory device 100.

For example, the processor 220 may transmit the first SLC write command SWCMD1L and the address information corresponding thereto to the nonvolatile memory device 100 (⑤); transmit the second SLC write command SWCMD1LC and the address information corresponding thereto to the nonvolatile memory device 100 (⑥); transmit the third SLC write command SWCMD1HC and the address information corresponding thereto to the nonvolatile memory device 100 (⑦); and transmit the fourth SLC write command SWCMD1M and the address information corresponding thereto to the nonvolatile memory device 100 (⑧).

The control logic 170 of the nonvolatile memory device 100 may control the nonvolatile memory device 100 to sequentially perform the SLC write operations corresponding to the SLC write commands SWCMD1L to SWCMD1M received from the processor 220.

For example, the control logic 170 may write the first-first write data DATA1L stored in the first data buffer 152 in the corresponding physical space of the SLC region of the memory block BLKo through the second I/O buffer 151 based on the first SLC write command SWCMD1L and the address information received from the processor 220 (⑤'). Similarly, the control logic 170 may write the first-second to first-fourth write data DATA1LC to DATA1M stored in the second to fourth data buffers 153 to 155 in the corresponding physical spaces of the SLC region of the memory block BLKo through the second I/O buffer 151 based on the second to fourth SLC write commands SWCMD1LC to SWCMD1M and the address information received from the processor 220 (⑥'~⑧'). For clarity, the pages of the SLC regions in which the first-first to first-fourth write data DATA1L to DATA1M are written may be referred to as 'first SLC pages'. The first-first to first-fourth write data DATA1L to DATA1M stored in the first to fourth data buffers 152 to 155 may not be deleted from the first to fourth data buffers 152 to 155 and may be retained in the first to fourth data buffers 152 to 155 even after the first-first to first-fourth write data DATA1L to DATA1M stored in the first to fourth data buffers 152 to 155 are stored in the SLC region.

Next, the processor 220 may generate first QLC write commands QW1CMD1L, QW1CMD1LC, QW1MD1HC, and QW1ICMD1M and sequentially transmit the generated first QLC write commands QW1CMD1L to QW1CMD1M to the nonvolatile memory device 100 (⑨~⑫). The processor 220 may transmit the first QLC write commands QW1CMD1L to QW1CMD1M with address information corresponding thereto to the nonvolatile memory device 100. The address information may indicate physical spaces in which the first-first to first-fourth write data DATA1L to DATA1M are to be stored in the QLC region of the nonvolatile memory device 100. The address information corresponding to the first QLC write commands QW1CMD1L to QW1CMD1M may indicate the same physical space as each other.

The control logic 170 of the nonvolatile memory device 100 may control the nonvolatile memory device 100 to sequentially perform the first QLC write operations corresponding to the first QLC write commands QW1CMD1L to QW1CMD1M received from the processor 220.

For example, the control logic 170 may control the nonvolatile memory device 100, based on the first-first QLC write command QW1CMD1L and the address information, to output the first-first write data DATA1L stored in the first data buffer 152 to the second I/O buffer 151 (⑨') and to write the first-first write data DATA1L input to the second I/O buffer 151 in the corresponding physical space of the QLC region of the memory block BLKo (⑨"). Similarly, the control logic 170 may control the nonvolatile memory device 100, based on the first-second to first-fourth QLC write commands QW1CMD1LC to QW1CMD1M and the address information, to output the first-second to first-fourth write data DATA1LC to DATA1M stored in the second to fourth data buffers 153 to 155 to the second I/O buffer 151 (⑩'~⑫') and to sequentially write the first-second to first-fourth write data DATA1LC to DATA1M input to the second I/O buffer 151 in the corresponding physical space of the QLC region of the memory block BLKo (⑩"~⑫"). For clarity, the page of the QLC region in which the first-first to first-fourth write data DATA1L to DATA1M are stored may be referred to as a 'first QLC page'.

The control logic 170 may control the page buffer 150 to delete the first-first to first-fourth write data DATA1L to DATA1M from the first to fourth data buffers 152 to 155 when the first QLC write operations for the first-first to first-fourth write data DATA1L to DATA1M are completed.

The first-first to first-fourth write data DATA1L to DATA1M may be written in separate physical spaces apart from each other in the SLC region of the memory block BLKo, for example, pages coupled to different word lines from each other. The threshold voltage distributions of memory cells included in the first SLC pages in which the SLC write operations for the first-first to first-fourth write data DATA1L to DATA1M are completed may be formed as shown in FIG. 7B.

The first-first to first-fourth write data DATA1L to DATA1M may be written in one physical space in the QLC region of the memory block BLKo, for example, in one physical page coupled to one word line. The one physical page in the QLC region may include four logical pages. The threshold voltage distributions of memory cells included in the first QLC page in which the first QLC write operations for the first-first to first-fourth write data DATA1L to DATA1M are completed may be formed as shown in FIG. 7C.

Figure 8A:
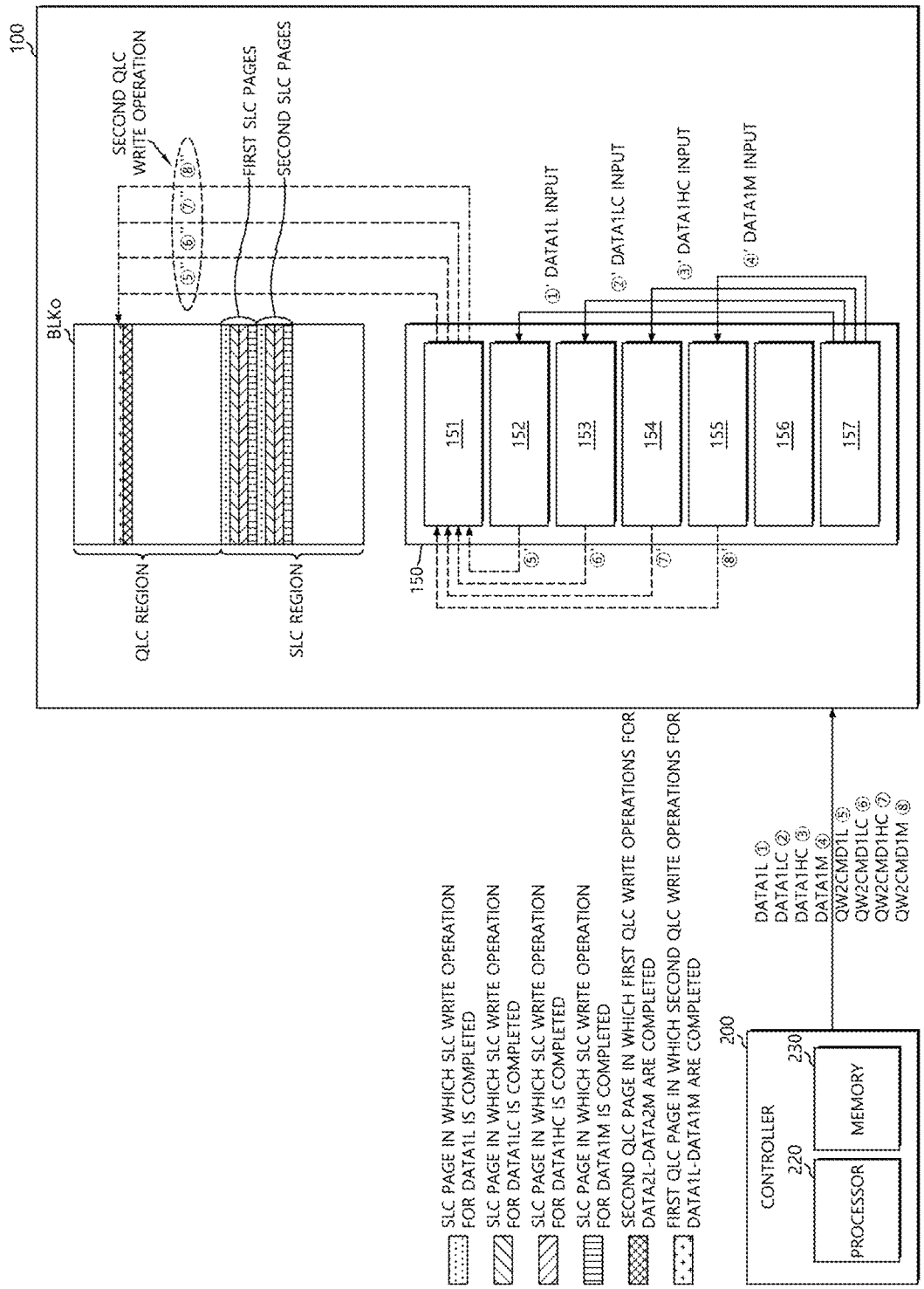
FIG. 8A is a diagram illustrating a second quadruple level cell (QLC) write operation according to an embodiment of the present disclosure.
Figure 8B:
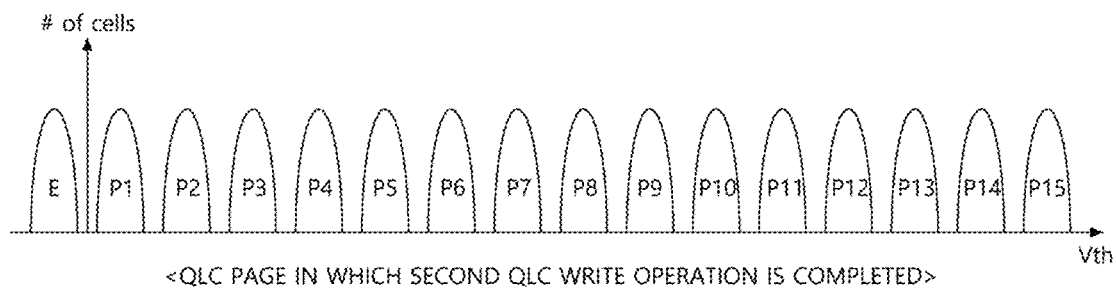
FIG. 8B is a diagram illustrating a threshold voltage distribution of a quadruple level cell (QLC) page in which a second QLC write operation is completed.

FIG. 8A is a diagram illustrating a second QLC write operation for the memory block BLKo according to an embodiment. FIG. 8B is a diagram illustrating a state in which the second QLC write operation is completed. By way of example, FIG. 8A illustrates a state that the SLC write operations for the second SLC pages next to the first SLC pages and the first QLC write operations for the second QLC page next to the first QLC page are completed. Although not specifically shown in FIG. 8A, the SLC write operations on the second SLC pages and the first QLC write operation on the second QLC page may be performed through the same method as the method illustrated in FIG. 7A. The write operations of FIGS. 8A and 8B for the nonvolatile memory device 100 may be performed by the processor 220 of the controller 200, as shown in FIGS. 1 and 2.

Referring to FIG. 8A, the processor 220 may sequentially transmit the first-first to first-fourth write data DATA1L to DATA1M to the nonvolatile memory device 100 (①~④). Although not specifically shown in FIG. 8A, the processor 220 may transmit the write data DATA1L to DATA1M with write data storage commands corresponding thereto to the nonvolatile memory device 100. The nonvolatile memory device 100 may store the first-first to first-fourth write data DATA1L to DATA1M in the corresponding first to fourth data buffers 152 to 155 of the page buffer 150 based on the write data storage commands received from the processor 220(①'~④').

Next, the processor 220 may generate second QLC write commands QW2CMD1L to QW2CMD1M and sequentially transmit the generated second QLC write commands QW2CMD1L to QW2CMD1M to the nonvolatile memory device 100 (⑤~⑧). The processor 220 may is transmit the second QLC write commands QW2CMD1L to QW2CMD1M with address information corresponding thereto to the nonvolatile memory device 100. The address information may indicate the physical space in which the first-first to first-fourth write data DATA1L to DATA1M are to be stored in the QLC region of the nonvolatile memory device 100, for example, a position of the first QLC page.

The control logic 170 of the nonvolatile memory device 100 may control the nonvolatile memory device 100 to sequentially perform the second QLC write operations corresponding to the second QLC write commands QW2CMD1L to QW2CMD1M received from the processor 220.

For example, the control logic 170 may control the nonvolatile memory device 100, based on the second-first QLC write command QW2CMD1L, to output the first-first write data DATA1L stored in the first data buffer 152 to the second I/O buffer 151 (⑤') and to write the first-first write data DATA1L input to the second I/O buffer 151 in the corresponding page (for example, the first QLC page) of the QLC region of the memory block BLKo (⑤"). Similarly, the control logic 170 may control the nonvolatile memory device 100, based on the second-second to second-fourth QLC write commands QW2CMD1LC to QW2CMD1M, to output the first-second to first-fourth write data DATA1LC to DATA1M stored in the second to fourth data buffers 153 to 155 to the second I/O buffer 151 (⑥'~⑦') and to sequentially write the first-second to first-fourth write data DATA1LC to DATA1M input to the second I/O buffer 151 in the first QLC page of the QLC region of the memory block BLKo (⑥"~⑦"). The threshold voltage distributions of memory cells included in the first QLC page in which the second QLC write operations for the first-first to first-fourth write data DATA1L to DATA1M are completed may be formed as shown in FIG. 8B.

In an embodiment, the SLC write operation for storing the first data in the SLC region of the memory block BLKo may be performed and then the first QLC write operation for storing the first data in the QLC region may be performed. It is noted that, after the completion of the SLC write operation, the first data stored in the data buffers 152 to 155 of the page buffer 150 may not be deleted and may be used in the first QLC write operation. Accordingly, since it is not necessary to input the same data repeatedly for the first QLC write operation, the performance of the write operation may be improved through an increase in the rate of the write operation.

Figure 9A:
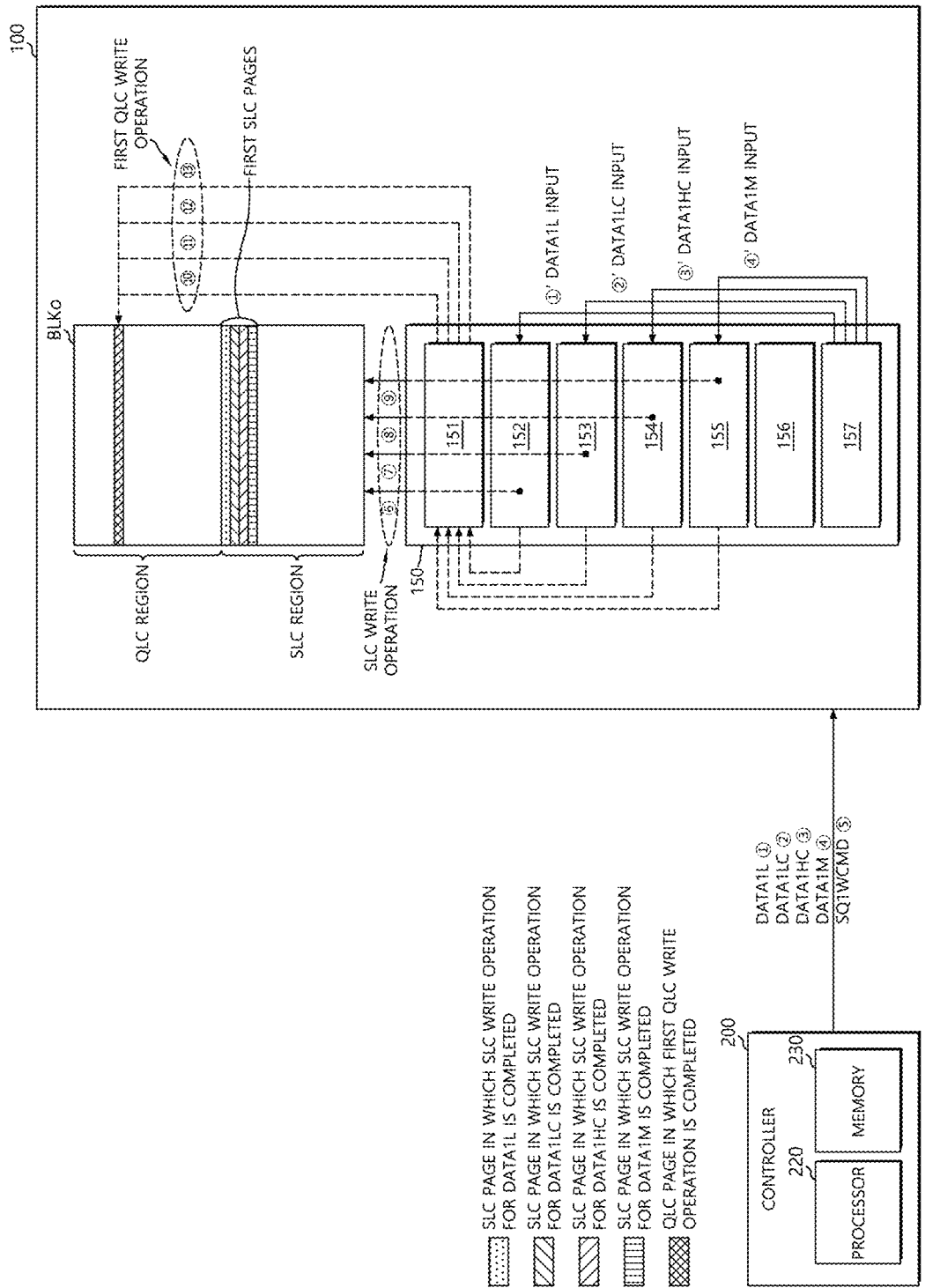
FIGS. 9A and 9B are diagrams illustrating a single level cell (SLC) write operation and a first quadruple level cell (QLC) write operation and a second QLC write operation according to an embodiment of the present disclosure.
Figure 9B:
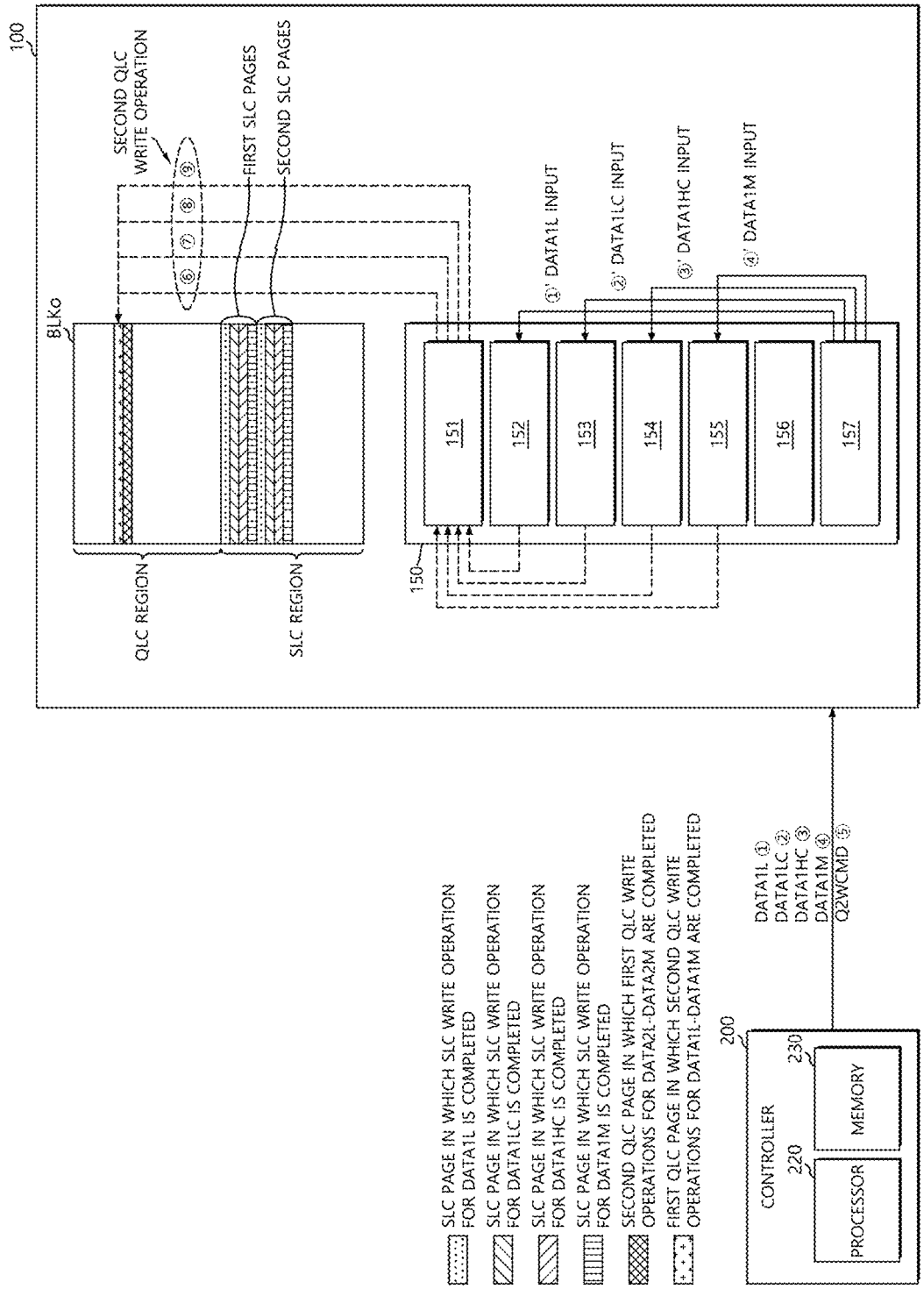

FIG. 9A is a diagram illustrating a SLC write operation and a first QLC write operation according to an embodiment. FIG. 9B is a diagram illustrating a second QLC write operation according to an embodiment. The write operations of FIGS. 9A and 9B for the nonvolatile memory device 100 may be performed by the processor 220 of the controller 200, as shown in FIGS. 1 and 2.

It has been exemplarily described in FIG. 7A and FIG. 8A that with respect to the first-first to first-fourth write data DATA1L to DATA1M, the number of commands for the SLC write operation, the number of commands for the first QLC write operation, and the number of commands for the second QLC write operation are the same as the number of data. An example in which the first-first to first-fourth write data DATA1L to DATA1M, the SLC write operation and the first QLC write operation are performed through one command and the second QLC write operation is performed through another command will be described with respect to FIGS. 9A and 9B.

Referring to FIG. 9A, the processor 220 may sequentially transmit the first-first to first-fourth write data DATA1L to DATA1M received from a host to the nonvolatile memory device 100 (①~④). The nonvolatile memory device 100 may store the first-first to first-fourth write data DATA1L to DATA1M sequentially received from the processor 220 in the corresponding first to fourth data buffers 152 to 155 of the page buffer 150 (①'~④').

The processor 220 may generate a complex write command SQ1WCMD for performing the SLC write operation and the first QLC write operation on the first-first to first-fourth write data DATA1L to DATA1M and transmit the generated complex write command SQ1WCMD to the nonvolatile memory device 100 (⑤). As described above, the complex write command SQ1WCMD may be for controlling the operation of the nonvolatile memory device 100 to sequentially perform the SLC write operation and the first QLC write operation on the first-first to first-fourth write data DATA1L to DATA1M stored in the first to fourth data buffers 152 to 155 of the page buffer 150.

For example, the complex write command SQ1WCMD may include control signals for instructing the nonvolatile memory device 100 to perform the SLC write operations on the first-first to first-fourth write data DATA1L to DATA1M and address information (for example, address information for the first SLC pages) indicating the storage positions in the SLC region for the first-first to first-fourth write data DATA1L to DATA1M. The complex write command SQ1WCMD may include control signals for instructing the nonvolatile memory device 100 to perform the first QLC write operations on the first-first to first-fourth write data DATA1L to DATA1M and address information (for example, address information for the first QLC page) indicating the storage position in the QLC region for the first-first to first-fourth write data DATA1L to DATA1M.

The nonvolatile memory device 100 may store the first-first to first-fourth write data DATA1L to DATA1M in the first SLC pages by sequentially performing the SLC write operations for the first-first to first-fourth write data DATA1L to DATA1M stored in the first to fourth data buffers 152 to 155 based on the complex write command SQ1WCMD received from the processor 220 (⑥~⑨) and store the first-first to first-fourth write data in the first QLC page by sequentially performing the first QLC write operations on the first-first to first-fourth write data DATA1L to DATA1M when the SLC write operations are completed (⑩~⑬).

Referring to FIG. 9B, when the SLC write operations for the second SLC pages next to the first SLC pages and the first QLC write operation for the second QLC page next to the first QLC page are completed, the processor 220 may sequentially transmit the first-first to first-fourth write data DATA1L to DATA1M to the nonvolatile memory device 100 again (①~④) and the nonvolatile memory device 100 may store the first-first to first-fourth write data DATA1L to DATA1M received from the processor 220 in the corresponding first to fourth data buffers 152 to 155 (①'~④').

The processor 220 may generate one second QLC write command Q2WCMD for performing the second QLC write operations on the first-first to first-fourth write data DATA1L to DATA1M and transmit the generated second QLC write command Q2WCMD to the nonvolatile memory device 100 (⑤). The second QLC write command Q2WCMD may be for controlling the operation of the nonvolatile memory device 100 to sequentially perform the second QLC write operations on the first-first to first-fourth write data DATA1L to DATA1M.

For example, the second QLC write command Q2WCMD may include control signals for instructing the nonvolatile memory device 100 to perform the second QLC write operations on the first-first to first-fourth write data DATA1L to DATA1M and address information (for example, address information for the first QLC page) indicating the storage position in the QLC region for the first-first to first-fourth write data DATA1L to DATA1M.

The nonvolatile memory device 100 may store the first-first to first-fourth write data DATA1L to DATA1M in the first QLC page by sequentially performing the second QLC write operations for the first-first to first-fourth write data DATA1L to DATA1M stored in the first to fourth data buffers 152 to 155 based on the second QLC write command Q2WCMD received from the processor 220 (⑥~⑨).

According to an embodiment, as shown in FIGS. 9A and 9B, the number of write commands transmitted from the processor 220 to the nonvolatile memory device 100 may be reduced and thus the speed of the write operation may be further improved.

Figure 10:
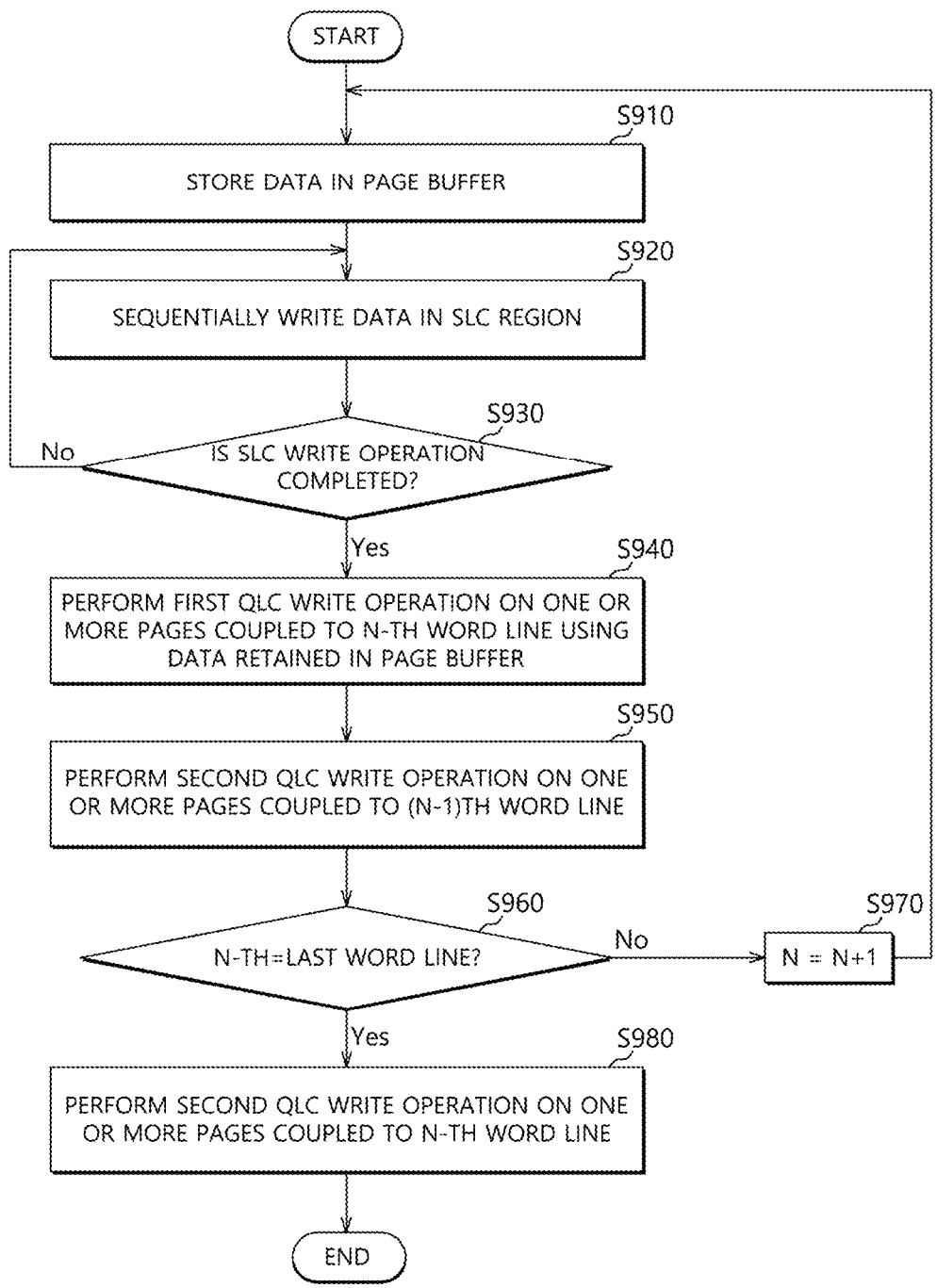
FIGS. 10 and 11 are flowcharts illustrating operating methods of a data storage device according to an embodiment of the present disclosure.

FIG. 10 is a flowchart illustrating an operation method of a data storage device according to an embodiment. The operating method of FIG. 10 will be described with reference to FIG. 10, along with other figures illustrating components used to implement the method.

Referring to FIG. 10, in operation S910, the control logic 170 of the nonvolatile memory device 100 may control the nonvolatile memory device 100 to store write data sequentially received from the controller 200 in the corresponding data buffers 152 to 155 of the page buffer 150.

Then, in operation S920, the control logic 170 may control the nonvolatile memory device 100 to perform the SLC write operations which sequentially writes the write data stored in the data buffers 152 to 155 in the corresponding pages (for example, the first SLC pages) of the SLC region of the memory block BLKo, based on the plurality of SLC write commands received from the controller 200. The control logic 170 may control the page buffer 150 so that the data stored in the data buffers 152 to 155 are not deleted and are retained in the data buffers 152 to 155 even after all the SLC write operations for the write data stored in the data buffers 152 to 155 are completed.

The processor 220 of the controller 200 may transmit the write data received from a host and the write data storage commands to the nonvolatile memory device 100 and then transmit a plurality of SLC write commands generated based on a write request received from the host to the nonvolatile memory device 100, but this is not limited thereto.

In operation S930, the processor 220 may determine whether or not all the SLC write operations for the write data stored in the data buffers 152 to 155 are completed. For example, when all the processing for the plurality of SLC write commands transmitted to the nonvolatile memory device 100 is completed in operation S920, the processor 220 may determine that the SLC write operations are completed. When all the processing for the plurality of SLC write commands is not completed in operation S920, the processor 220 may determine that the SLC write operations are not completed. The determining of whether or not the processing of the SLC write commands is completed may be performed based on status information for the SLC write commands provided from the nonvolatile memory device 100. When it is determined that all the SLC write operations are completed (S930, Yes), the processor 220 may proceed to operation S940. When it is determined that not all SLC write operations are completed (S930, No), the processor 220 may return to step S920 and repeat step S920 until the SLC write operations are completed.

In operation S940, the processor 220 may generate a is plurality of first QLC write commands for one or more pages coupled to an n-th word line of the memory block BLKo and sequentially transmit the plurality of first QLC write commands to the nonvolatile memory device 100.

The control logic 170 of the nonvolatile memory device 100 may control the nonvolatile memory device 100 to perform the first QLC write operations which sequentially write the write data stored in the data buffers 152 to 155 of the page buffer 150 in the corresponding page (for example, the first QLC page) of the QLC region of the memory block BLKo, based on the first QLC write commands received from the processor 220. When the first QLC write operations for the write data stored in the data buffers 152 to 155 are completed, the control logic 170 may control the page buffer 150 to delete all the write data stored in the data buffers 152 to 155.

In operation S950, the processor 220 may generate a plurality of second QLC write commands for one or more pages coupled to an (n−1)-th word line of the memory block BLKo and sequentially transmit the plurality of second QLC write commands and the plurality of pieces of data corresponding thereto to the nonvolatile memory device 100. When the (n−1)-th word line is not present, the operation S940 may be omitted. For example, when the n-th word line is a first word line of the memory block BLKo, operation S950 may be omitted.

In operation S950, the processor 220 may preferentially transmit the write data corresponding to the plurality of second QLC write commands to the nonvolatile memory device 100 before transmitting the plurality of second QLC write commands to the nonvolatile memory device 100. The nonvolatile memory device 100 may store write data received from the processor 220 in the corresponding data buffers 152 to 155.

The control logic 170 of the nonvolatile memory device 100 may control the nonvolatile memory device 100 to perform the second QLC write operations which write the write data stored in the data buffers 152 to 155 in a corresponding page of the QLC region of the memory block BLKo, based on the plurality of second QLC write commands received from the controller 200.

In operation S960, the processor 220 may determine whether or not the n-th word line is the last word line of the memory block BLKo. When it is determined that the n-th word line is not the last word line (S960, No), the processor 220 may proceed to operation S970.

In operation S970, the processor 220 may transmit write data to be stored in one or more pages coupled to a word line (for example, (n+1)-th word line) next to the nth word line of the memory block BLKo to the nonvolatile memory device 100. Then, the processor 220 may generate a plurality of SLC write commands for performing the SLC write operations on the write data and transmit the plurality of SLC write commands to the nonvolatile memory device 100. Next, the processor 220 may proceed to operation S910. Operations S910 to S970 may be repeatedly performed until the nth word line is the last word line of the memory block BLKo.

In operation S960, when it is determined that the n-th word line is the last word line (S960, Yes), the processor 220 may proceed to operation S980.

In operation S980, the processor 220 may generate a plurality of second QLC write commands for one or more pages coupled to the n-th word line of the memory block BLKo and sequentially transmit the plurality of second QLC write commands to the nonvolatile memory device 100. The processor 220 may preferentially transmit the write data to be stored in the pages coupled to the nth word line to the nonvolatile memory device 100 before transmitting the plurality of second QLC write commands to the nonvolatile memory device 100, and the nonvolatile memory device 100 may store the write data received from the processor 220 in corresponding data buffers 152 to 155.

The control logic 170 of the nonvolatile memory device 100 may control the nonvolatile memory device 100 to perform the second QLC write operations which sequentially write the write data stored in the data buffers 152 to 155 in a corresponding page of the QLC region of the memory block BLKo, based on the plurality of second QLC write commands sequentially received from the controller 200.

Figure 11:
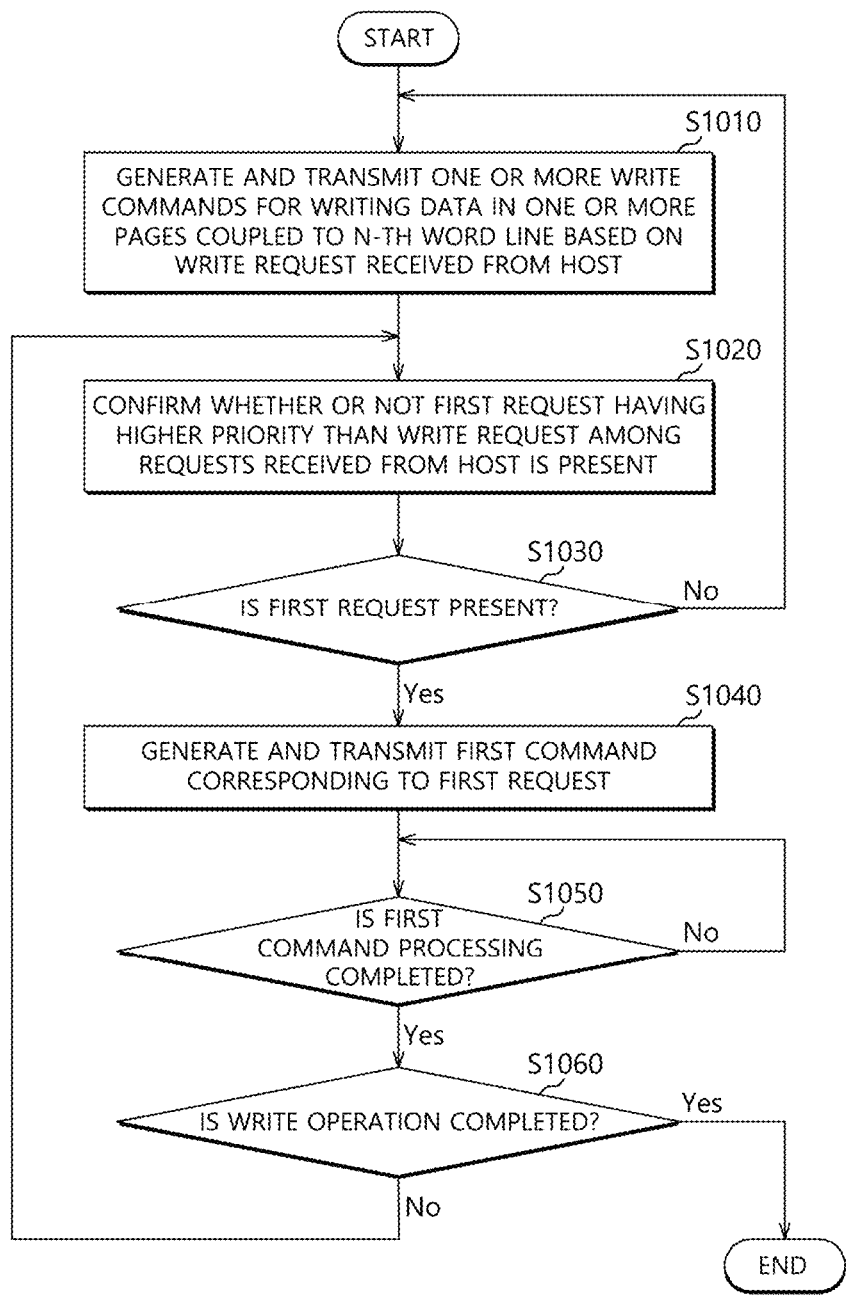

FIG. 11 is a flowchart illustrating an operating method of a data storage device according to an embodiment. The operating method of FIG. 11 will be described with reference to any one of FIG. 1 to FIG. 9B.

Referring to FIG. 11, in operation S1010, the processor 220 of the controller 200 may generate, based on a write request for one or more pages coupled to the nth word line received from a host, one or more write commands for storing write data in corresponding pages. Then, the processor 220 may sequentially transmit the generated write commands to the nonvolatile memory device 100.

Here, the one or more write commands may include all the write data storage commands for storing the write data in the data buffers 152 to 155 of the page buffer 150 of the nonvolatile memory device 100, the SLC write commands for storing the write data stored in the data buffers in the SLC pages, the first and second QLC write commands for storing the write data stored in the data buffers in the QLC pages, the complex write command for the SLC write operation and the first QLC write operation, and the like as described in FIGS. 7A, 8A, 9A, and 9B and corresponding portions of the detailed description.

In operation S1020, the processor 220 may confirm whether or not a first request having a higher priority than the write request among requests received from a host is present. For example, without being limited thereto, the processor 220 may confirm whether or not the first request is present by scanning a request queue (not shown) for sequentially queueing the requests received from the host. The processor 220 may continuously monitor the requests queued in the to request queue while sequentially transmitting the write commands.

In operation S1030, the processor 220 may determine whether or not the first request is present. When it is determined that the first request is not present (S1030, No), the processor 220 may proceed to operation S1010. When it is determined that the first request is present (S1030, Yes), the processor 220 may proceed to operation S1040.

In operation S1040, the processor 220 may generate the first command based on the first request and transmit the generated first command to the nonvolatile memory device 100. When an operation for a previously transmitted write command is being performed in the nonvolatile memory device 100, the processor 220 may transmit a suspend command for interrupting the operation for the corresponding write command to the nonvolatile memory device 100 and then transmit the first command to the nonvolatile memory device 100.

In operation S1050, the processor 220 may determine whether or not the processing of the first command is completed. When status information including the processing completion information of the first command is received from the nonvolatile memory device 100, the processor 220 may determine that the processing of the first command is completed. When it is determined that the processing of the first command is completed (S1050, Yes), the processor 220 may proceed to operation S1060.

In operation S1060, the processor 220 may determine whether or not the write operation corresponding to the write request received from the host in operation S1010 is completed. When the status information including the processing completion information of the last write command for the corresponding write operation is received from the nonvolatile memory device 100, the processor 220 may determine that the write operation is completed. When it is determined that the write operation is not completed (S1060, No), the processor 220 may proceed to operation S1020. When it is determined that the write operation is completed (S1060, Yes), the process is terminated.

FIG. 12A is a diagram illustrating a process for preferentially processing a command having a high priority during data transfer according to an embodiment. By way of example, and in the context of the description here, the first command having a high priority is transmitted after two write data DATA1L and DATA1LC are transmitted and the first command is a read command.

Referring to FIG. 12A, the processor 220 may sequentially transmit the first-first and first-second write data DATA1L and DATA1LC and the write data storage commands corresponding thereto to the nonvolatile memory device 100 (①) and (②)). The nonvolatile memory device 100 may sequentially store the received first-first and first-second write data DATA1L and DATA1LC in the corresponding first and second data buffers 152 and 153 based on the write data storage commands (①' and ②').

The processor 220 may transmit a read command RCMD1 for reading data pre-stored in the QLC region of the memory block BLKo to the nonvolatile memory device 100 (③)). The control logic 170 of the nonvolatile memory device 100 may read out data DATA1 from a corresponding position of the QLC region based on the received read command RCMD1. Then, the control logic 170 may store the read data DATA1. In the second I/O buffer 151 of the page buffer 150 (④)) and move the data DATA1 to the preliminary data buffer 156 from the second I/O buffer 151 (④)'). Next, the control logic 170 may transmit the data DATA1 stored in the preliminary data buffer 156 to the controller 200 through the first I/O buffer 157 (④)'').

Figure 12B:
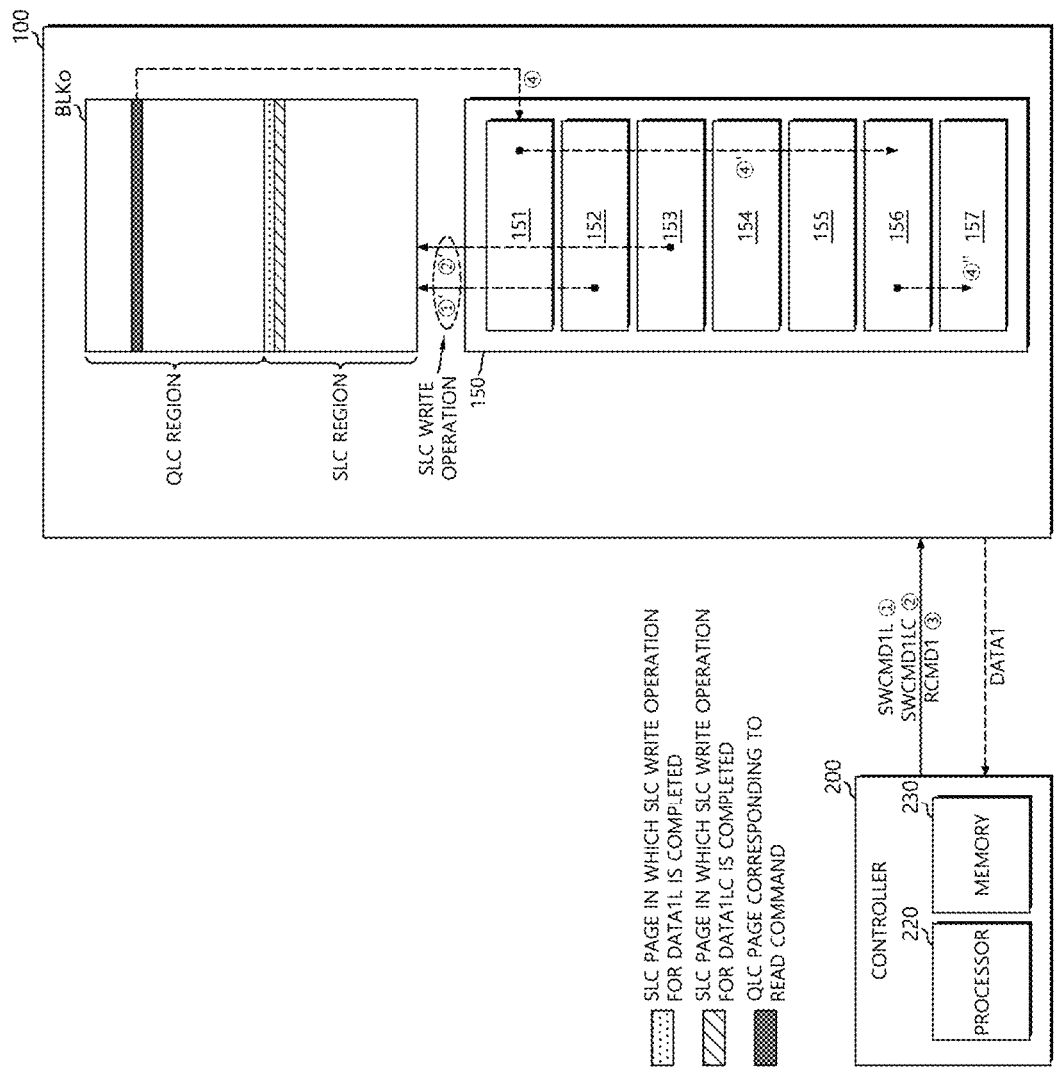
FIG. 12B is a diagram illustrating a process for preferentially processing a command having a high priority during a single level cell (SLC) write operation according to an embodiment of the present invention.

FIG. 12B is a diagram illustrating a process for preferentially processing a command having a high priority during a single level cell (SLC) write operation according to an embodiment. By way of example, and in the context of description here, a first command having a high priority is transmitted after two SLC write commands SWCMD1L and SWCMD1LC are transmitted.

Referring to FIG. 12B, the processor 220 may sequentially transmit the SLC write command SWCMD1L for the first-first write data and the SLC write command SWCMD1LC for the first-second write data to the nonvolatile memory device 100 (①)) and (②)). The nonvolatile memory device 100 may sequentially store the first-first and first-second write data DATA1L and DATA1LC stored in the first and second data buffers 152 and 153 in the corresponding positions of the SLC region based on the received SLC write commands SWCMD1L and SWCMD1C (①' and ②').

The processor 220 may transmit the read command RCMD1 for reading out data pre-stored in the QLC region of the memory block BLKo to the nonvolatile memory device 100 (③)). The control logic 170 of the nonvolatile memory device 100 may read out data DATA1 from the corresponding position of the QLC region based on the received command RCMD1. Then, the control logic 170 may store the read data DATA1 in the second I/O buffer 151 of the page buffer 150 (④)) and move the data DATA1 to the preliminary data buffer 156 from the second I/O buffer 151 (④)'). Next, the control logic 170 may transmit the data DATA1 stored in the preliminary data buffer 156 to the controller 200 through the first I/O buffer 157 (④)'').

Figure 12C:
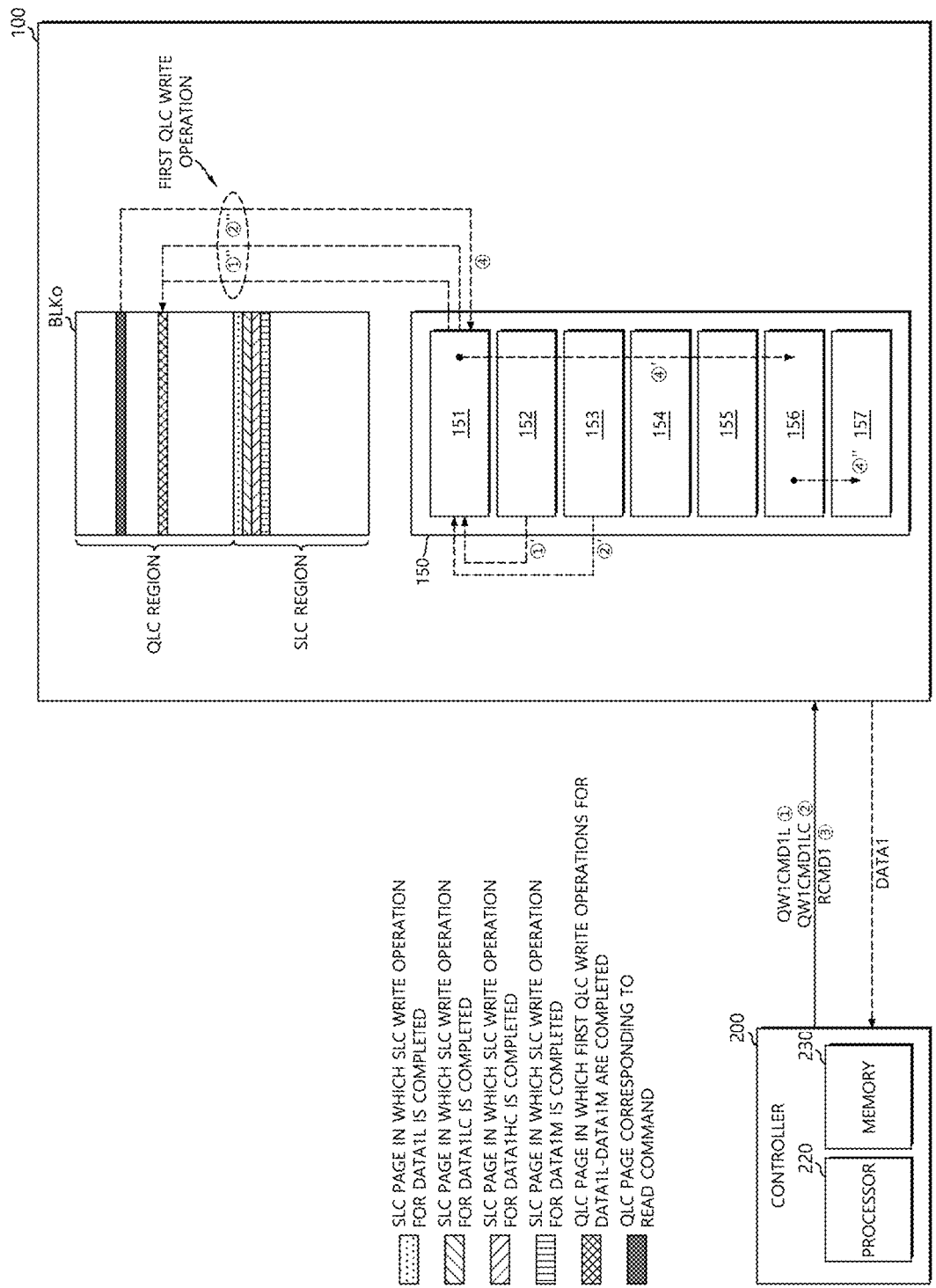
FIG. 12C is a diagram illustrating a process for preferentially processing a command having a high priority during a quadruple level cell (QLC) write operation according to an embodiment of the present invention.

FIG. 12C is a diagram illustrating a process for preferentially processing a command having a high priority during a quadruple level cell (QLC) write operation according to an embodiment. By way of example, and in the context of description here, a first command having a high priority is transmitted after two first QLC write commands QW1CMD1L and QW1CMD1LC are transmitted.

Referring to FIG. 12C, the processor 220 may sequentially transmit the first QLC write command QW1CMD1L for the first-first write data and the first QLC write command QW1CMD1LC for the first-second write data to the nonvolatile memory device 100 (①) and (②)). The nonvolatile memory device 100 may sequentially store the first-first and first-second write data DATA1L and DATA1LC stored in the first and second data buffers 152 and 153 in the corresponding position of the QLC region based on the received first QLC write commands QW1CMD1L and QW1CMD1LC (①' and ②').

The processor 220 may transmit the read command RCMD1 for reading out data pre-stored in the QLC region of the memory block BLKo to the nonvolatile memory device 100 (③)). The control logic 170 of the nonvolatile memory device 100 may read out the data DATA1 from the corresponding position of the QLC region based on the received command RCMD1. Then, the control logic 170 may store the read data DATA1 in the second I/O buffer 151 of the page buffer 150 (④)) and move the data DATA1 to the preliminary data buffer 156 from the second I/O buffer 151 (④)'). Next, the control logic 170 may transmit the data DATA1 stored in the preliminary data buffer 156 to the controller 200 through the first I/O buffer 157 (④)'').

As described above, when an event, in which a command having a high priority has to be processed during the performing of the write operation to store write data in the memory according to a write request, occurs, the high priority command may preferentially be processed using an empty preliminary data buffer, and thus the performance of the data storage device 10 may be improved.

The processor 220 may control the nonvolatile memory device 100 to preferentially process the first request until the first request having a higher priority than the write request among requests queued in a request queue is not present.

Figure 13:
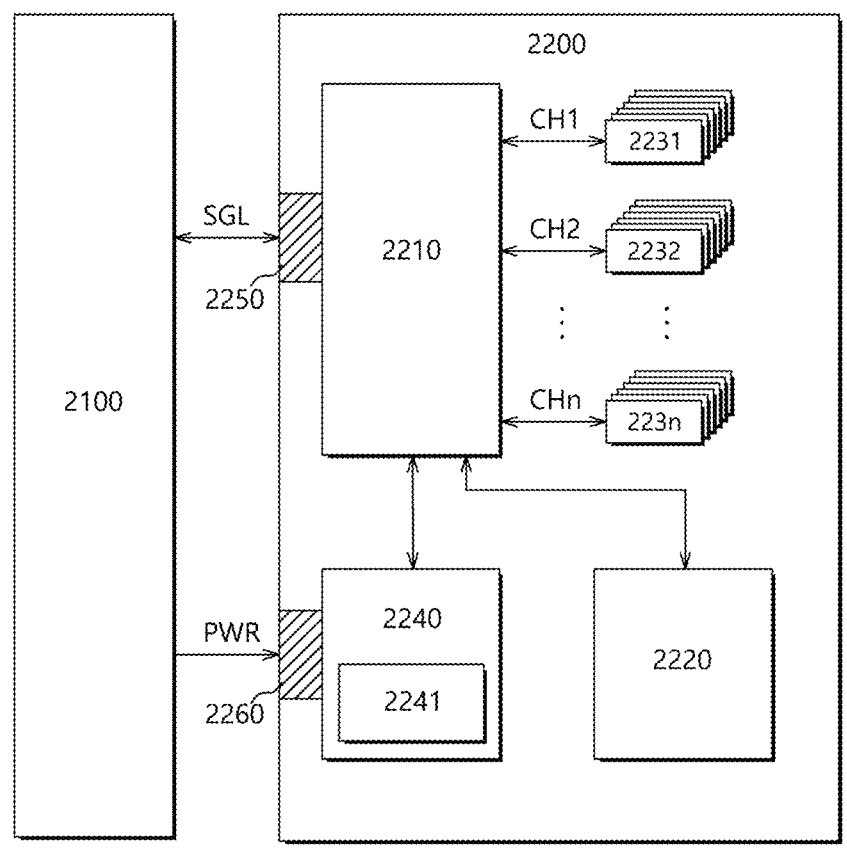
FIG. 13 is a diagram illustrating a data processing system including a solid state drive (SSD) according to an embodiment of the present disclosure.

FIG. 13 is a diagram illustrating a data processing system 2000 according to an embodiment. Referring to FIG. 13, the data processing system 2000 may include a host apparatus 2100 and a solid state drive (SSD) 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured as any of various types of connectors according to an interfacing method between the host apparatus 2100 and the SSD 2200.

Figure 14:
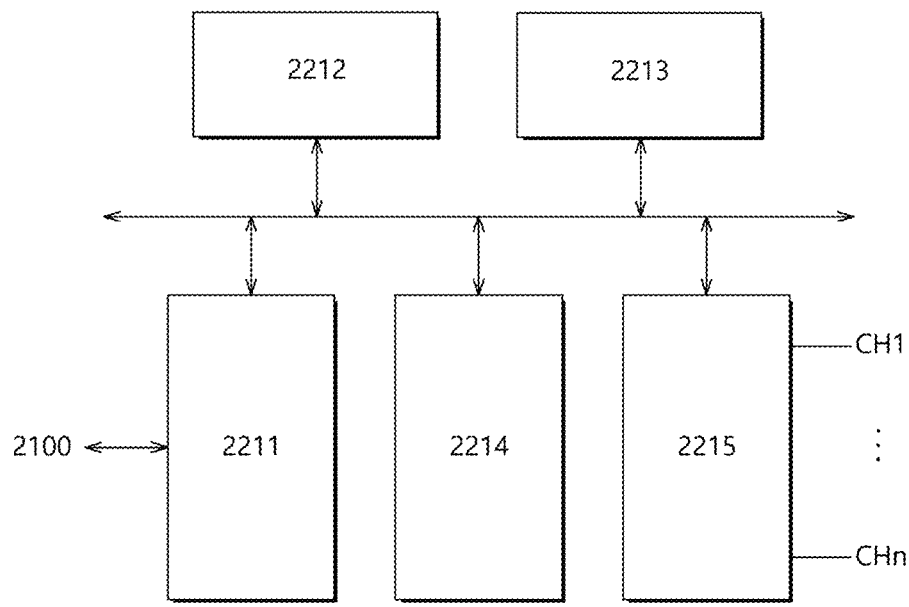
FIG. 14 is a diagram illustrating a controller illustrated in FIG. 14.

FIG. 14 is a diagram illustrating the controller 2210 of FIG. 13. Referring to FIG. 14, the controller 2210 may include a host interface 2211, a control component 2212, a random access memory (RAM) 2213, an error correction code (ECC) component 2214, and a memory interface 2215.

The host interface 2211 may perform interfacing between the host apparatus 2100 and the SSD 2200 according to a protocol of the host apparatus 2100. For example, the host interface 2211 may communicate with the host apparatus 2100 through any of a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-e or PCIe) protocol, and a universal flash storage (UFS) protocol. The host interface 2211 may perform a disc emulation function that the host apparatus 2100 recognizes the SSD 2200 as a general-purpose data storage apparatus, for example, a hard disc drive HDD.

The control component 2212 may analyze and process the signal SGL input from the host apparatus 2100. The control component 2212 may control operations of internal functional blocks according to firmware and/or software for driving the SDD 2200. The RAM 2213 may be operated as a working memory for driving the firmware or software.

The ECC component 2214 may generate parity data for the data to be transferred to the nonvolatile memory devices 2231 to 223n. The generated parity data may be stored in the nonvolatile memory devices 2231 to 223n together with the data. The ECC component 2214 may detect errors for data read from the nonvolatile memory devices 2231 to 223n based on the parity data. When detected errors are within a correctable range, the ECC component 2214 may correct the detected errors.

The memory interface 2215 may provide a control signal such as a command and an address to the nonvolatile memory devices 2231 to 223n according to control of the control component 2212. The memory interface 2215 may exchange data with the nonvolatile memory devices 2231 to 223n according to control of the control component 2212. For example, the memory interface 2215 may provide data stored in the buffer memory device 2220 to the nonvolatile memory devices 2231 to 223n or provide data read from the nonvolatile memory devices 2231 to 223n to the buffer memory device 2220.

Figure 15:
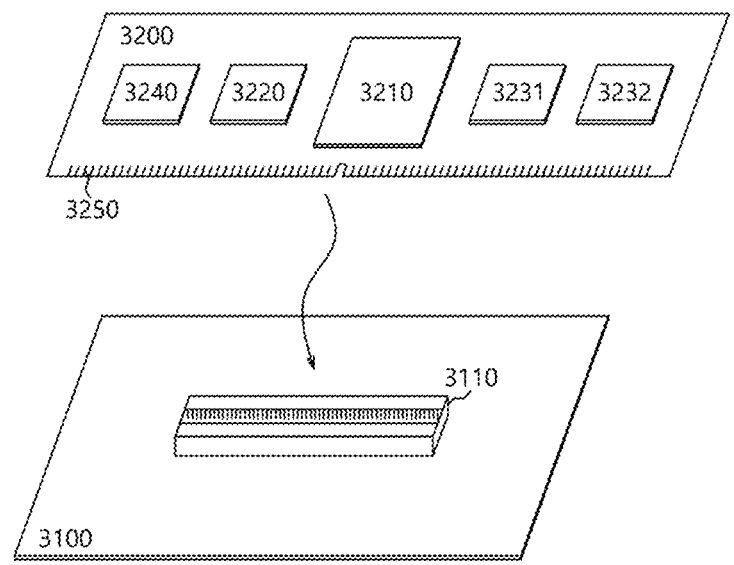
FIG. 15 is a diagram illustrating a data processing system including a data storage apparatus according to an embodiment of the present disclosure.

FIG. 15 is a diagram illustrating a data processing system 3000 according to an embodiment. Referring to FIG. 15, the data processing system 3000 may include a host apparatus 3100 and a data storage apparatus 3200.

The host apparatus 3100 may be configured in a board form such as a printed circuit board (PCB). Although not shown in FIG. 15, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may have the same configuration as that of the controller 2210 illustrated in FIG. 14.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 16:
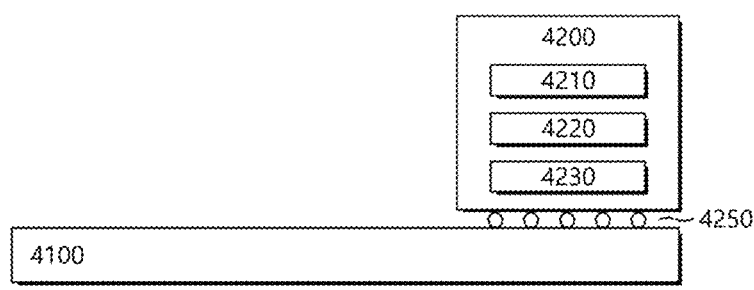
FIG. 16 is a diagram illustrating a data processing system including a data storage apparatus according to an embodiment of the present disclosure.

FIG. 16 is a diagram illustrating a data processing system 4000 according to an embodiment. Referring to FIG. 16, the data processing system 4000 may include a host apparatus 4100 and a data storage apparatus 4200.

The host apparatus 4100 may be configured in a board form such as a printed circuit board (PCB). Although not shown in FIG. 16, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 14.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 17:
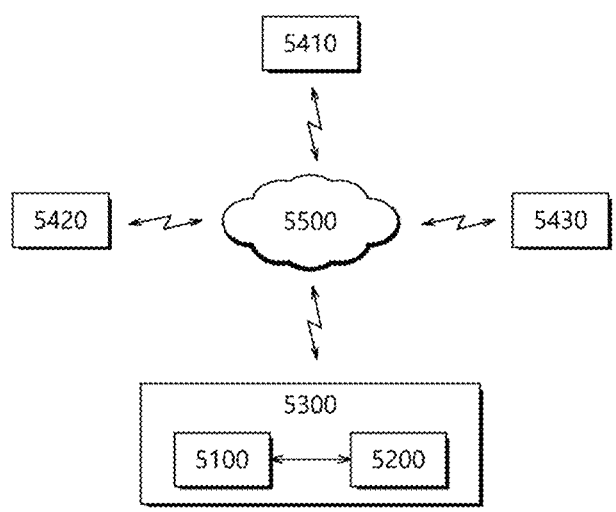
FIG. 17 is a diagram illustrating a network system including a data storage apparatus according to an embodiment of the present disclosure.

FIG. 17 is a diagram illustrating a network system 5000 including a data storage apparatus according to an embodiment. Referring to FIG. 17, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage apparatus 10 of FIG. 1, the data storage apparatus 2200 of FIG. 13, the data storage apparatus 3200 of FIG. 15, or the data storage apparatus 4200 of FIG. 16.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications will be apparent to those skilled in the art in view of the present disclosure, and all are intended to be embraced by the present invention to the extent they fall within the scope of the appended claims.

What is claimed is:

1. A data storage device comprising:
a nonvolatile memory device including at least one memory block having a first region and a second region; and
a controller configured to generate a plurality of write commands for the first region and the second region and transmit the plurality of write commands to the nonvolatile memory device,
wherein the nonvolatile memory device includes:
a page buffer configured to store data to be written in the at least one memory block; and
control logic configured to control, based on the plurality of write commands, the nonvolatile memory device to write the data in the first region and retain the data in the page buffer and to write the retained data in the second region,
wherein the plurality of write commands includes:
a first group of write commands for writing the data in the first region; and
a second group of write commands for writing the data in the second region,
wherein, when the first group of write commands and the second group of write commands are write commands related to one or more pages coupled to an n-th word line, n being a natural number greater than 1, and when all the processing of the second group of write commands are completed, the controller generates a third group of write commands for one or more pages coupled to an (n−1)-th word line and transmits the third group of write commands to the nonvolatile memory device,
wherein the first region includes memory cells in each of which 1-bit data is to be stored, and the second region includes memory cells in each of which m-bit data is to be stored, wherein m is a natural number of 2 or more, and
wherein the first group of write commands includes a write command for storing the 1-bit data in a corresponding page of the first region, the second group of write commands includes a write command for primarily storing the m-bit data in a corresponding first page of the second region, and the third group of write commands includes a write command for secondarily storing the m-bit data in the first page of the second region.

2. The data storage device of claim 1, wherein the controller generates the second group of write commands and transmits the second group of write commands to the nonvolatile memory device when processing of the first group of write commands is completed.

3. The data storage device of claim 1, wherein the controller determines whether or not the n-th word line is a last word line, and when the n-th word line is the last word line, the controller generates the third group of write commands for one or more pages coupled to the n-th word line and transmits the third group of write commands to the nonvolatile memory device.

4. The data storage device of claim 1, wherein the page buffer includes:
a first input/output buffer configured to transmit data to, and receive data from, the controller;
a plurality of data buffers in which data is to be stored; and
a second input/output buffer configured to transmit data to, and receive data from, the at least one memory block.

5. The data storage device of claim 1, wherein the controller determines whether or not a first command having a higher priority than remaining write commands, among the plurality of write commands, is present, preferentially transmits the first command to the nonvolatile memory device when the first command is present, and transmits the remaining write commands to the nonvolatile memory device when processing of the first command is completed.

6. An operating method of a data storage device which includes a nonvolatile memory device including at least one memory block having a first region and a second region; and a controller configured to control the nonvolatile memory device, the method comprising:
performing a first write operation which includes writing data in the first region based on a plurality of write commands provided from the controller and retaining the data in a page buffer of the nonvolatile memory device;

performing a second write operation which includes writing the retained data in the second region based on the plurality of write commands, wherein the plurality of write commands includes a first group of write commands for writing the data in the first region and a second group of write commands for writing the data in the second region; and performing, when the first group of write commands and the second group of write commands are write commands related to one or more pages coupled to an n-th word line, n being a natural number of above 1, a third write operation on one or more pages coupled to an (n−1)-th word line based on a third write command for the one or more pages coupled to the (n-1)-th word line provided from the controller after the performing of the second write operation, wherein the first region includes memory cells in each of which 1-bit data is to be stored and the second region includes memory cells in each of which m-bit data is to be stored, wherein m is a natural number of 2 or more, wherein the first group of write commands includes a write command for storing the 1-bit data in a corresponding page of the first region, the second group of write commands includes a write command for primarily storing the m-bit data in a corresponding first page of the second region, and the third group of write commands includes a write command for secondarily storing the m-bit data in the first page of the second region.

7. The method of claim 6, wherein the performing of the first write operation further includes determining whether or not the performing of the first write operation is completed.

8. The method of claim 7, further comprising, when the performing of the first write operation is completed, generating, by the controller, the second group of write commands and transmitting the second group of write commands to the nonvolatile memory device.

9. The method of claim 6, further comprising, after the performing of the third write operation,
determining whether or not the n-th word line is a last word line; and
performing the third write operation on one or more pages coupled to the n-th word line based on the third group of write commands for the one or more pages coupled to the n-th word line provided from the controller when the n-th word line is the last word line.

10. The method of claim 6, further comprising determining, by the controller, whether or not a first command having a higher priority than remaining write commands, among the plurality of write commands, is present, preferentially transmitting the first command to the nonvolatile memory device when the first command is present, and transmitting the remaining write commands to the nonvolatile memory device when processing of the first command is completed.

11. A data storage device comprising:
a memory device including a page buffer, a first memory region and a second memory region; and
a controller suitable for controlling the memory device to perform a write operation,
wherein the memory device is configured to:
receive write data from the controller;
store the write data in the page buffer;
write the stored data in the first memory region;
retain the written data in the page buffer; and
write the retained data in the second memory region,
wherein the controller is configured to generate a plurality of write commands for the first memory region and the second memory region and transmit the plurality of write commands to the memory device,
wherein the plurality of write commands includes:
a first group of write commands for writing the data in the first memory region; and
a second group of write commands for writing the data in the second memory region,
wherein, when the first group of write commands and the second group of write commands are write commands related to one or more pages coupled to an n-th word line, n being a natural number greater than 1, and when all the processing of the second group of write commands are completed, the controller generates a third group of write commands for one or more pages coupled to an (n−1)-th word line and transmits the third group of write commands to the memory device,
wherein the first memory region includes memory cells in each of which 1-bit data is to be stored, and the second memory region includes memory cells in each of which m-bit data is to be stored, wherein m is a natural number of 2 or more, and
wherein the first group of write commands includes a write command for storing the 1-bit data in a corresponding page of the first memory region, the second group of write commands includes a write command for primarily storing the m-bit data in a corresponding first page of the second memory region, and the third group of write commands includes a write command for secondarily storing the m-bit data in the first page of the second memory region.

* * * * *